(12) United States Patent
Shanbhag et al.

(10) Patent No.: US 6,940,898 B2
(45) Date of Patent: Sep. 6, 2005

(54) ADAPTIVE COEFFICIENT SIGNAL GENERATOR FOR ADAPTIVE SIGNAL EQUALIZERS WITH FRACTIONALLY-SPACED FEEDBACK

(75) Inventors: Abhijit G. Shanbhag, San Jose, CA (US); Qian Yu, Cupertino, CA (US); Abhijit Phanse, Santa Clara, CA (US); Jishnu Bhattacharjee, San Jose, CA (US); Debanjan Mukherjee, San Jose, CA (US); Fabian Giroud, San Jose, CA (US); Venugopal Balasubramonian, San Jose, CA (US)

(73) Assignee: Scintera Networks, Inc., San Jose, CA (US)

(*) Notice: Subject to any disclaimer, the term of this patent is extended or adjusted under 35 U.S.C. 154(b) by 329 days.

(21) Appl. No.: 10/290,571

(22) Filed: Nov. 8, 2002

(65) Prior Publication Data

US 2004/0091040 A1 May 13, 2004

(51) Int. Cl.[7] .............................. H03H 7/30; H03H 7/40; H03K 5/159
(52) U.S. Cl. ...................... 375/234; 375/229; 375/230; 375/231; 375/232; 375/233; 375/235; 375/236
(58) Field of Search ................................ 375/229–236; 331/18; 348/614; 708/322

(56) References Cited

U.S. PATENT DOCUMENTS 5,191,462 A 3/1993 Gitlin et al.
6,240,133 B1 5/2001 Sommer et al.
2001/0007479 A1 * 7/2001 Kim ........................... 348/614
2001/0026197 A1 * 10/2001 Tomisato et al. ............. 333/18

OTHER PUBLICATIONS

International Search Report for International Application No. PCT/US03/35352, dated Dec. 14, 2004.

John G. Proakis, Digital Communications Fourth Edition, 2001, pp. 598–659, McGraw–Hill Companies, Inc., New York, NY.

John G. Proakis, Digital Communications Fourth Edition, 2001, pp. 660–708, McGraw–Hill Companies, Inc., New York, NY.

Heinrich Meyr et al., Digital Communication Receivers, Synchronization, Channel Estimation, and Signal Processing, 1998, pp. 270–323, John Wiley & Sons, Inc., New York, NY.

* cited by examiner

*Primary Examiner*—Stephen Chin
*Assistant Examiner*—Curtis Odom
(74) *Attorney, Agent, or Firm*—Vedder Price Kaufman & Kammholz, P.C.

(57) ABSTRACT

An adaptive coefficient signal generator for use in an adaptive signal equalizer with fractionally-spaced feedback. The signals representing the feedback tap coefficients are generated in conjunction with a timing interpolation parameter such that the fractionally-spaced feedback circuitry dynamically emulates symbol-spaced feedback circuitry.

60 Claims, 7 Drawing Sheets

ADAPTIVE COEFFICIENT SIGNAL GENERATOR FOR ADAPTIVE SIGNAL EQUALIZERS WITH FRACTIONALLY-SPACED FEEDBACK

BACKGROUND OF THE INVENTION

1. Field of the Invention

The present invention relates to signal transmission and detection, and in particular, to techniques for compensating for signal distortions caused by signal dispersion and non-linearities within the signal transmission media.

2. Description of the Related Art

Signal processing architectures for intersymbol interference (ISI) equalization as used for communications transmission and/or storage systems may be divided into two categories: discrete-time architecture and continuous-time architecture. Discrete-time architectures, commonly used in current systems, use a sampled approach to render the input continuous-time, analog waveform in discrete form. Typically, a high resolution A/D converter, which follows the analog anti-aliasing filter, is used as the sampler at the analog front end. Continuous-time architectures use an analog continuous-time approach which directly processes and equalizes the incoming analog waveform while remaining in the continuous time domain until the final data bit stream is generated.

At present, those signal processing architectures having a feedforward transversal filter and a feedback filter as their basic components are considered, and in particular, the following scenarios: discrete-time/continuous-time architectures with fractionally-spaced (i.e., tap spacing less than symbol-spaced) feedforward taps; continuous-time architecture with feedback that is nominally symbol-spaced; continuous-time/discrete-time architectures with fractionally-spaced feedback. For purposes of the presently claimed invention, the following discussion concerns "fat tap" adaptation to cover the continuous-time architecture with fractionally-spaced feedback; however, such discussion may be readily extended to cover the other scenarios as well.

Fractional-spaced feedforward filters have commonly been used either as stand-alone linear equalizers or in combination with Decision Feedback. Advantages of fractional-spaced versus symbol-spaced feedforward filters include: added robustness to constant or slowly varying sampling phase offset or sampling jitter; and improved signal-to-noise ratio (SNR) sensitivity, particularly in the absence of complete channel information, due to the role of the fractional-spaced filter as a combined adaptive matched filter and equalizer.

The adaptation technique for the tap coefficients have always implicitly assumed independence in the adaptation of the successive tap coefficients, which has been based on minimizing the mean squared error (MSE) as computed using the difference between the slicer input and output. This adaptation technique is referred to as LMSE (least mean squared error) or MMSE (minimized mean squared error) adaptation. It can be shown that the LMSE adaptation for both fractional feedforward or symbol spaced feedback at iteration k+1 reduces to the following coefficient update equations:

$$\underline{c}^{(k+1)} = \underline{c}^{(k)} + \mu e^{(k)} \underline{s} \text{(discrete-time adaptation case)}$$

where $\underline{c}^{(k)}$ is the tap coefficient vector and $e^{(k)}$ the corresponding error at the $k^{th}$ iteration, $\underline{s}$ is the vector with components as the input waveform to the corresponding tap mixer and $\mu$ is a constant and is an adaptation parameter; and $$\underline{c} = \int_0^T \mu \cdot e(t) \underline{s}(t) \, dt$$

(continuous-time adaptation case)
with similar terminology as above.

When continuous-time feedback is considered, a number of difficulties are encountered. For example, it is difficult and sometimes unfeasible to design precisely symbol-spaced, flat group delay filters. If the total group delay on the feedback path for canceling successive past symbols is even slightly different from the corresponding symbol period, the performance loss can be substantial. This may necessitate the need for using fractionally-spaced feedback filters. Fractionally-spaced feedback filters may also be needed to account for the slicer-induced jitter and/or the data bits pattern-specific group delays due to frequency dependent group delays of the slicer, mixer and any other analog/digital component on the feedback data path. Further when an equalizer with fractionally-spaced feedback taps is used, independent LMS adaptation of the successive feedback taps fails because of the strongly correlated nature of the fractional tap-spaced feedback data.

SUMMARY OF THE INVENTION

In accordance with the presently claimed invention, an adaptive coefficient signal generator for use in an adaptive signal equalizer with fractionally-spaced feedback generates signals representing feedback tap coefficients in conjunction with a timing interpolation parameter such that the fractionally-spaced feedback circuitry dynamically emulates symbol-spaced feedback circuitry. Advantages realized with the presently claimed invention include avoidance of a need for precisely symbol-spaced flat group delay filters, and the ability to account for slicer-induced jitter as well as variable group delays specific to certain data bit patterns due to frequency dependent group delays of various system elements (e.g., slicer(s) and mixer(s) in the feedback data path).

In accordance with one embodiment of the presently claimed invention, an adaptive coefficient signal generator for use in an adaptive signal equalizer with fractionally-spaced feedback and in which an adaptively equalized data signal forms a pre-slicer data signal that is sliced to provide a post-slicer data signal includes signal multiplication circuitry, signal combining circuitry, signal integration circuitry and signal complement circuitry. First signal multiplication circuitry receives and multiplies a plurality of multiplicand signals to provide a plurality of interim product signals and a plurality of final product signals. The plurality of multiplicand signals includes: a first data signal corresponding to a post-slicer data signal and having a data symbol period associated therewith; a second data signal corresponding to the first data signal and delayed by a fraction of the data symbol period; an error signal corresponding to a difference between the post-slicer data signal and a pre-slicer data signal; a first adaptation control signal having a first value bounded by lower and upper values; and a second adaptation control signal having a second value related to a difference between a normalized value and the first value. The plurality of interim product signals includes: a first interim product signal corresponding to a product of the first data signal and the error signal; and a second interim product signal corresponding to a product of the second data signal and the error signal. The plurality of final product signals includes: a first final product signal corresponding to a product of the first interim product signal and the first adaptation control signal; and a second final product signal corresponding to a product of the second interim product signal and the second adaptation control signal. First signal combining circuitry, coupled to the first signal multiplication circuitry, receives and combines the plurality of final product signals to provide a first combined signal. First signal integration circuitry, coupled to the first signal combining circuitry, receives and integrates the first combined signal to provide a third adaptation control signal. Second signal multiplication circuitry, coupled to the first signal integration circuitry, receives and multiplies the first, second and third adaptation control signals to provide a plurality of adaptive coefficient signals. Second signal combining circuitry, coupled to the first signal multiplication circuitry, receives and combines the plurality of interim product signals to provide a second combined signal. Third signal multiplication circuitry, coupled to the first signal integration circuitry and the second signal combining circuitry, receives and multiplies the third adaptation control signal and the second combined signal to provide another product signal. Second signal integration circuitry, coupled to the first signal multiplication circuitry, the second signal multiplication circuitry and the third signal multiplication circuitry, receives and integrates the another product signal to provide the first adaptation control signal. The signal complement circuitry, coupled to the first signal multiplication circuitry, the second signal multiplication circuitry and the second signal integration circuitry, receives and complements the first adaptation control signal to provide the second adaptation control signal.

In accordance with another embodiment of the presently claimed invention, an adaptive coefficient signal generator for use in an adaptive signal equalizer with fractionally-spaced feedback and in which an adaptively equalized data signal forms a pre-slicer data signal that is sliced to provide a post-slicer data signal includes signal multiplication circuitry and control signal generator circuitry. The signal multiplication circuitry receives and multiplies a plurality of multiplicand signals to provide a plurality of product signals. The plurality of multiplicand signals includes: a first data signal corresponding to a post-slicer data signal and having a data symbol period associated therewith; a second data signal corresponding to the first data signal and delayed by a fraction of the data symbol period; and an error signal corresponding to a difference between the post-slicer data signal and a pre-slicer data signal. The plurality of product signals includes: a first product signal corresponding to a product of the first data signal and the error signal; and a second product signal corresponding to a product of the second data signal and the error signal. First control signal generator circuitry, coupled to the first signal multiplication circuitry, receives and processes the plurality of product signals and first and second adaptation control signals and in response thereto provides a plurality of adaptive coefficient signals and a third adaptation control signal related to one of the plurality of adaptive coefficient signals. Second control signal generator circuitry, coupled to the signal multiplication circuitry and the first control signal generator circuitry, receives and processes the plurality of product signals and the third adaptation control signal and in response thereto provides the first and second adaptation control signals.

In accordance with another embodiment of the presently claimed invention, an adaptive coefficient signal generator for use in an adaptive signal equalizer with fractionally-spaced feedback and in which an equalization feedback signal adaptively equalizes a data signal to form a pre-slicer data signal that is sliced to provide a post-slicer data signal includes signal multiplication circuitry, signal combining circuitry, signal integration circuitry, signal differentiation circuitry and signal complement circuitry. First signal multiplication circuitry receives and multiplies a plurality of multiplicand signals to provide a plurality of product signals. The plurality of multiplicand signals includes: a first data signal corresponding to a post-slicer data signal and having a data symbol period associated therewith; a second data signal corresponding to the first data signal and delayed by a fraction of the data symbol period; an error signal corresponding to a difference between the post-slicer data signal and a pre-slicer data signal; a first adaptation control signal having a first value bounded by lower and upper values; and a second adaptation control signal having a second value related to a difference between a normalized value and the first value. The plurality of product signals includes: a first product signal corresponding to a product of the first data signal, the error signal and the first adaptation control signal; and a second product signal corresponding to a product of the second data signal, the error signal and the second adaptation control signal. The signal combining circuitry, coupled to the first signal multiplication circuitry, receives and combines the plurality of product signals to provide a first combined signal. The signal integration circuitry, coupled to the first signal combining circuitry, receives and integrates the first combined signal to provide a third adaptation control signal. Second signal multiplication circuitry, coupled to the signal integration circuitry, receives and multiplies the first, second and third adaptation control signals to provide a plurality of adaptive coefficient signals. The signal differentiation circuitry receives and differentiates an equalization feedback signal to provide a differentiated signal. Third signal multiplication circuitry, coupled to the first signal multiplication circuitry, the second signal multiplication circuitry and signal differentiation circuitry, receives and multiplies the error signal and the differentiated signal to provide the first adaptation control signal. The signal complement circuitry, coupled to the first signal multiplication circuitry, the second signal multiplication circuitry and the third signal multiplication circuitry, that receives and complements the first adaptation control signal to provide the second adaptation control signal.

In accordance with another embodiment of the presently claimed invention, an adaptive coefficient signal generator for use in an adaptive signal equalizer with fractionally-spaced feedback and in which an equalization feedback signal adaptively equalizes a data signal to form a pre-slicer data signal that is sliced to provide a post-slicer data signal includes first and second control signal generator circuitry. The first control signal generator circuitry receives and processes a plurality of input signals and first and second adaptation control signals and in response thereto provides a plurality of adaptive coefficient signals. The plurality of input signals includes: a first data signal corresponding to a post-slicer data signal and having a data symbol period associated therewith; a second data signal corresponding to the first data signal and delayed by a fraction of the data symbol period; and an error signal corresponding to a difference between the post-slicer data signal and a pre-slicer data signal. The second control signal generator circuitry, coupled to the first control signal generator circuitry, receives and processes the error signal and an equalization feedback signal and in response thereto provides the first and second adaptation control signals.

In accordance with another embodiment of the presently claimed invention, a method for generating adaptive coefficient signals for adaptive signal equalization using fractionally-spaced feedback to generate an adaptively equalized data signal as a pre-slicer data signal that is sliced to provide a post-slicer data signal includes:

receiving and multiplying a plurality of multiplicand signals and generating a plurality of interim product signals and a plurality of final product signals, wherein the plurality of multiplicand signals includes
a first data signal corresponding to a post-slicer data signal and having a data symbol period associated therewith,
a second data signal corresponding to the first data signal and delayed by a fraction of the data symbol period,
an error signal corresponding to a difference between the post-slicer data signal and a pre-slicer data signal,
a first adaptation control signal having a first value bounded by lower and upper values, and
a second adaptation control signal having a second value related to a difference between a normalized value and the first value,
the plurality of interim product signals includes
a first interim product signal corresponding to a product of the first data signal and the error signal, and
a second interim product signal corresponding to a product of the second data signal and the error signal, and
the plurality of final product signals includes
a first final product signal corresponding to a product of the first interim product signal and the first adaptation control signal, and
a second final product signal corresponding to a product of the second interim product signal and the second adaptation control signal;
combining the plurality of final product signals and generating a first combined signal;
integrating the first combined signal and generating a third adaptation control signal;
multiplying the first, second and third adaptation control signals and generating a plurality of adaptive coefficient signals;
combining the plurality of interim product signals and generating a second combined signal;
multiplying the third adaptation control signal and the second combined signal and generating another product signal;
integrating the another product signal and generating the first adaptation control signal; and
complementing the first adaptation control signal and generating the second adaptation control signal.

In accordance with another embodiment of the presently claimed invention, a method for generating adaptive coefficient signals for adaptive signal equalization using fractionally-spaced feedback to generate an adaptively equalized data signal as a pre-slicer data signal that is sliced to provide a post-slicer data signal includes:

multiplying a plurality of multiplicand signals and generating a first plurality of product signals, wherein the plurality of multiplicand signals includes
a first data signal corresponding to a post-slicer data signal and having a data symbol period associated therewith,
a second data signal corresponding to the first data signal and delayed by a fraction of the data symbol period, and
an error signal corresponding to a difference between the post-slicer data signal and a pre-slicer data signal, and
the first plurality of product signals includes
a first product signal corresponding to a product of the first data signal and the error signal, and
a second product signal corresponding to a product of the second data signal and the error signal;
processing the first plurality of product signals and first and second adaptation control signals and generating a plurality of adaptive coefficient signals and a third adaptation control signal related to one of the plurality of adaptive coefficient signals; and
processing the first plurality of product signals and the third adaptation control signal and generating the first and second adaptation control signals.

In accordance with another embodiment of the presently claimed invention, a method for generating adaptive coefficient signals for adaptive signal equalization using fractionally-spaced feedback and an equalization feedback signal to generate an adaptively equalized data signal as a pre-slicer data signal that is sliced to provide a post-slicer data signal includes:

receiving and multiplying a plurality of multiplicand signals and generating a plurality of product signals, wherein the plurality of multiplicand signals includes
a first data signal corresponding to a post-slicer data signal and having a data symbol period associated therewith,
a second data signal corresponding to the first data signal and delayed by a fraction of the data symbol period,
an error signal corresponding to a difference between the post-slicer data signal and a pre-slicer data signal,
a first adaptation control signal having a first value bounded by lower and upper values, and
a second adaptation control signal having a second value related to a difference between a normalized value and the first value, and
the plurality of product signals includes
a first product signal corresponding to a product of the first data signal, the error signal and the first adaptation control signal, and
a second product signal corresponding to a product of the second data signal, the error signal and the second adaptation control signal;
combining the plurality of product signals and generating a first combined signal;
integrating the first combined signal and generating a third adaptation control signal;
multiplying the first, second and third adaptation control signals and generating a plurality of adaptive coefficient signals;
receiving and differentiating an equalization feedback signal and generating a differentiated signal;
multiplying the error signal and the differentiated signal and generating the first adaptation control signal; and
complementing the first adaptation control signal and generating the second adaptation control signal.

In accordance with another embodiment of the presently claimed invention, a method for generating adaptive coefficient signals for adaptive signal equalization using fractionally-spaced feedback and an equalization feedback signal to generate an adaptively equalized data signal as a pre-slicer data signal that is sliced to provide a post-slicer data signal includes:

receiving and processing a plurality of input signals and first and second adaptation control signals and generating a plurality of adaptive coefficient signals, wherein the plurality of input signals includes a first data signal corresponding to a post-slicer data signal and having a data symbol period associated therewith, a second data signal corresponding to the first data signal and delayed by a fraction of the data symbol period, and an error signal corresponding to a difference between the post-slicer data signal and a pre-slicer data signal; and receiving and processing the error signal and an equalization feedback signal and generating the first and second adaptation control signals.

BRIEF DESCIPTION OF THE DRAWINGS

DETAILED DESCRIPTION OF THE INVENTION

Figure 1:
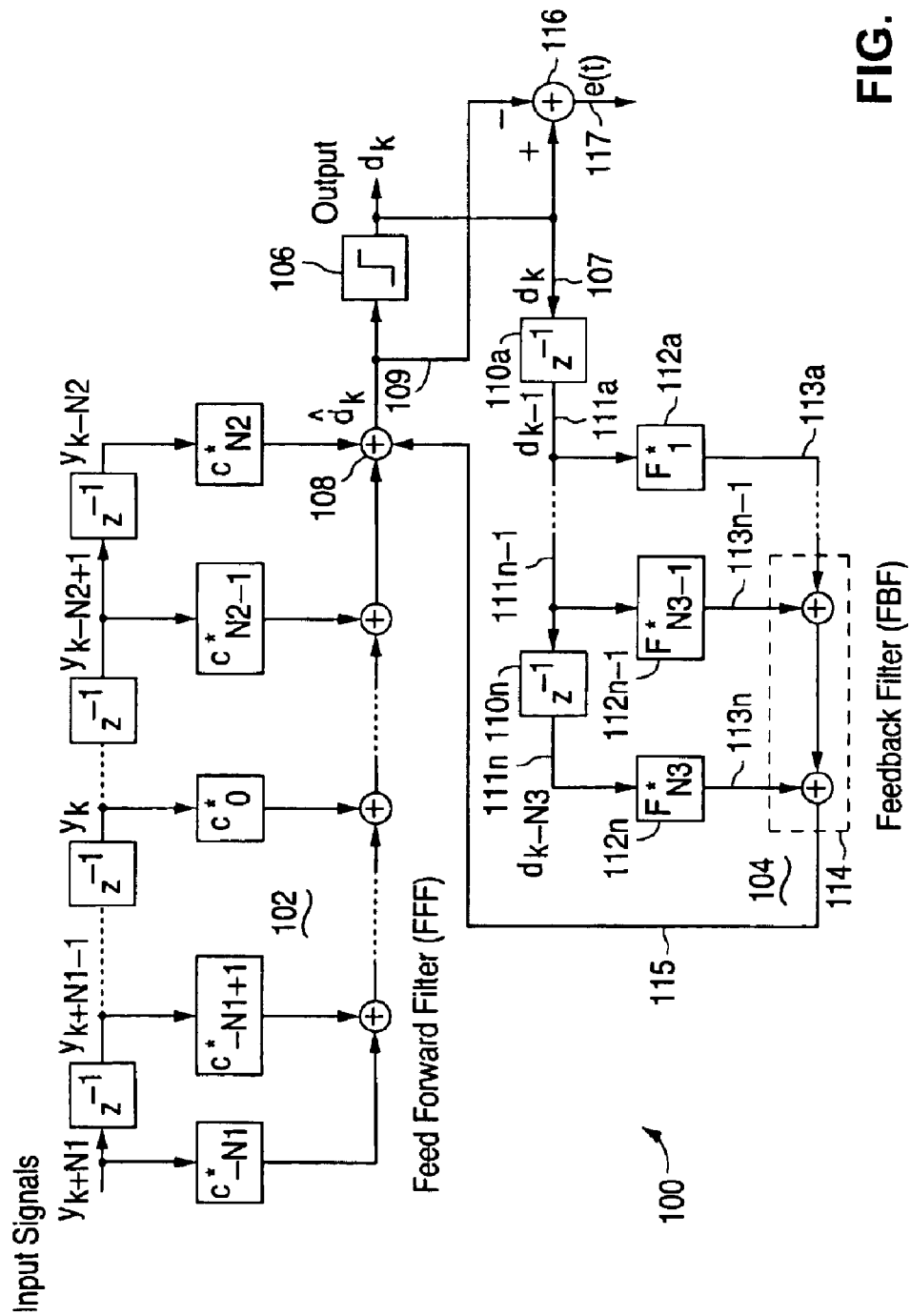
FIG. 1 is a block diagram of decision feedback equalization (DFE) circuitry in which an adaptive coefficient signal generator in accordance with the presently claimed invention can advantageously provide for improved data signal equalization.

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

The subject matter discussed herein, including the presently claimed invention, is compatible and suitable for use with the subject matter disclosed in the following copending, commonly assigned patent applications (the disclosures of which are incorporated herein by reference): U.S. patent application Ser. No. 10/117,293, filed Apr. 5, 2002, and entitled "Compensation Circuit For Reducing Intersymbol Interference Products Caused By Signal Transmission Via Dispersive Media"; U.S. patent application Ser. No. 10/179,689, filed Jun. 24, 2002, and entitled "Crosstalk Compensation Engine For Reducing Signal Crosstalk Effects Within A Date Signal"; U.S. patent application Ser. No. 10/244,500, filed Sep. 16, 2002, and entitled "Compensation Method For Reducing Intersymbol Interference Products Caused By Signal Transmission Via Dispersive Media"; U.S. patent application Ser. No. 10/290,674, filed Nov. 8, 2002, and entitled "Compensation Circuit And Method For Reducing Intersymbol Interference Products Caused By Signal Transmission Via Dispersive Media"; U.S. patent application Ser. No. 10/290,993, filed Nov. 8, 2002, and entitled "Adaptive Signal Equalizer With Adaptive Error Timing And Precursor/Postcursor Configuration Control"; U.S. patent application Ser. No. 10/321,893, filed Dec. 17, 2002, and entitled "Adaptive Signal Latency Control For Communication Systems Signals"; U.S. patent application Ser. No. 10/321,876, filed Dec. 17, 2002, and entitled "Adaptive Signal Equalizer With Adaptive Error Timing And Precursor/Postcursor Configuration Control"; and U.S. patent application Ser. No. 10/179,996, filed Jun. 24, 2002, and entitled "Programmable Decoding of Codes of Varying Error-Correction Capability".

In accordance with the presently claimed invention, a group of two or more adjacent fractionally-spaced feedback taps are viewed to be correlated and corresponding to essentially the same symbol so that this group of fractionally-spaced taps essentially emulates a symbol-spaced feedback tap. Such a group of fractionally-spaced taps that emulates a symbol-spaced feedback tap is referred herein as a "fat tap." Thus, successive fat taps emulate different symbol-spaced feedback taps. The adaptation of the taps within the fat tap should have some kind of adaptive timing interpolation between them so that the effective timing of the fat tap corresponds to the corresponding symbol timing. Further, both taps in the fat tap need to adapt together using LMSE adaptation, for instance, since their inputs are correlated.

The emphasized case will be that in which successive fat taps consist of disjoint taps and, thus, represent independent symbols (e.g., referred to as Independent Fat Tap Adaptation (IFTA)). Also emphasized will be the case with the constraint of only two taps within the fat tap.

Let the feedback tap spacing be denoted by $\tau$ which is sufficiently less than the symbol period. It is assumed that the feedback symbol waveform is approximately piece-wise linear within the span of time interval $\tau$. Thus, if the feedback signal is denoted as s(t), the parametric equation of the line passing through s(t) and s(t−τ) may be denoted via:

$$r \cdot s(t) + (1-r) \cdot s(t-\tau)$$

for the parameter r (in general, −∞<r<∞). With the piecewise linear assumption of s(t), we have:

$$s(t-\tau_r) \approx r \cdot s(t) + (1-r) \cdot s(t-\tau)$$

for a suitable choice of the delay $\tau_r$. Note that with the piecewise linear approximation:

$$\tau_r \approx (1-r) \cdot \tau.$$

With a linear approximation of the feedback signal waveform, we represent the two tap coefficients of the fat tap as c·r and c·(1−r) where the quantity r is the timing interpolation parameter which ideally should achieve effective symbol spaced timing for the fat tap, and the quantity c is used for LMSE adaptation for estimating the past ISI that needs to be cancelled. Thus, with these two parameters, the fat tap tries to emulate the corresponding symbol-spaced feedback tap with LMS tap coefficient c. The correlation ratio between the two adapting taps of the fat tap is then $$\frac{r}{1-r}.$$

It is then required to adapt the parameters c and r for the fat tap.

For the continuous-time case, the LMSE adaptation of the parameters c and r can then be shown to be:

$$c(t) = \mu_c \cdot \int_0^t e(v) \cdot [r \cdot s(v) + (1-r) \cdot s(v-\tau)] dv;$$

$$r(t) = \mu_r \cdot \int_0^t c(v) \cdot e(v) \cdot [s(v) - s(v-\tau)] dv$$

If, as may be typical, sign(c)=−1, and since $$s(v) - s(v-\tau) \approx k \frac{d}{dt} s(v-\tau_r),$$

for a constant k, the update equation for r(t) may also be simplified to:

$$r(t) = -\mu_r^1 \cdot \int_0^t e(v) \cdot \frac{d}{dv} s(v-\tau_r) dv.$$

Note that $$\frac{d}{dt} s(t-\tau_r)$$

may easily be implemented by passing the output of the fat tap through a C-R differentiator block, which is a high-pass filter.

For the discrete-time case, the LMSE adaptation of the parameters c and r can then be shown to be:

$$c^{(k+1)} = c^{(k)} + \mu_c \cdot e^{(k)} \cdot [r^{(k)} \cdot s(t) + (1-r^{(k)}) \cdot s(t-\tau)]$$

$$r^{(k+1)} = r^{(k)} + \mu_r \cdot c^{(k)} \cdot e^{(k)} \cdot [s(t) - s(t-\tau)]$$

The update equation for r can also be simplified to (if its known that sign(c)=−1):

$$r^{(k+1)} = r^{(k)} - \mu_r \cdot e^{(k)} \cdot [s(t) - s(t-\tau)]$$

The next step is determining which pair of two (or more) taps belong to the same fat tap. The specific two adjacent taps which form a fat tap corresponding to a specific past symbol may vary depending on the group delay variations of different analog or digital components within the feedback path such as the slicer, delay elements, summer, mixer, etc. One approach is to hypothesize that different (disjoint) pairs of taps correspond to different fat taps corresponding to different past symbols. Then, depending on the values of the feedback tap coefficients after convergence, specifically the timing interpolation parameter which should ideally be within the range (0,1) and/or the hypothesis which corresponds to the minimum mean squared error, the winning hypothesis may be selected as part of the start-up procedures of the circuit. (As noted above, ideally 0<r<1, although in general, −∞<r<∞. However, it should be understood that maximum advantages of timing interpolation as provided by the presently claimed invention are realized when 0<r<1 (e.g., where the complement 1−r of r when r=0.2 is 1−r=1−0.2=0.8). When r lies outside of the range (0,1), i.e., −∞<r<0 or 1<r<∞ (e.g., where the complement 1−r of r when r=1.2 is 1−r=1−1.2=−0.8), extrapolation takes place instead of interpolation and performance degradation may result.

Referring to FIG. 1, a decision feedback equalizer (DFE) 100 typically includes a feed forward filter 102 and a feedback filter 104. The feedback filter 104 processes the decisions $d_k$ from the output of the final signal slicer 106. The coefficients, or gains, $F^*_i$ can be adjusted to cancel ISI on the current symbol based upon past detected symbols. The feed forward filter 102 has $N_1+N_2+1$ taps while the feedback filter 104 has $N_3$ taps, and the output $\hat{d}_k$ 109 of the final signal summer 108 can be expressed as follows:

$$\hat{d}_k = \sum_{n=-N_1}^{N_2} c^*_n y_{k-n} + \sum_{i=1}^{N_3} F_i d_{k-i}$$

where $c^*_n$=tap gains for feed forward filter 102
$y_n$=input signals to feed forward filter 102
$F^*_i$=tap gains for feedback filter 104
$d_i(i<k)$=previous decision made upon detected signal $d_k$ Accordingly, once the output $d_k$ is provided by the output summer 108 of the feed forward filter 102, the final output $d_k$ is decided. Then, the final output $d_k$ and the previous decisions $d_{k-1}$, $d_{k-2}$, . . . are fed back through the feedback filter 104, thereby providing the solution for the next decision $\hat{d}_{k+1}$1 at the output 109 of the final signal summer 108 in the feed forward filter 102 in accordance with the foregoing equation.

More specifically, with respect to the feedback filter section 104, the output signal 107 is successively delayed through a sequence of time delay elements 110a, . . . 110n (e.g., with each successive time delay element 110 imparting a time delay equal to one symbol). Each of the successively time-delayed signals 111a, . . . 111n are processed in their respective adaptive gain stages 112a, . . . 112n to provide corresponding adaptive feedback signals 113a, . . . 113n which are summed together in a signal summing circuit 114 to produce the equalization feedback signal 115.

The adaptive gain stages 112a, . . . 112n process their respective time-delayed signals 111a, . . . 111n based upon an error signal 117 representing the error, if any, between the post-slicer data signal 107 and the pre-slicer data signal 109. This error signal 117 is typically generated by subtracting the pre-slicer data signal 109 from the post-slicer data signal 107 in a signal summing circuit 116.

Figure 2:
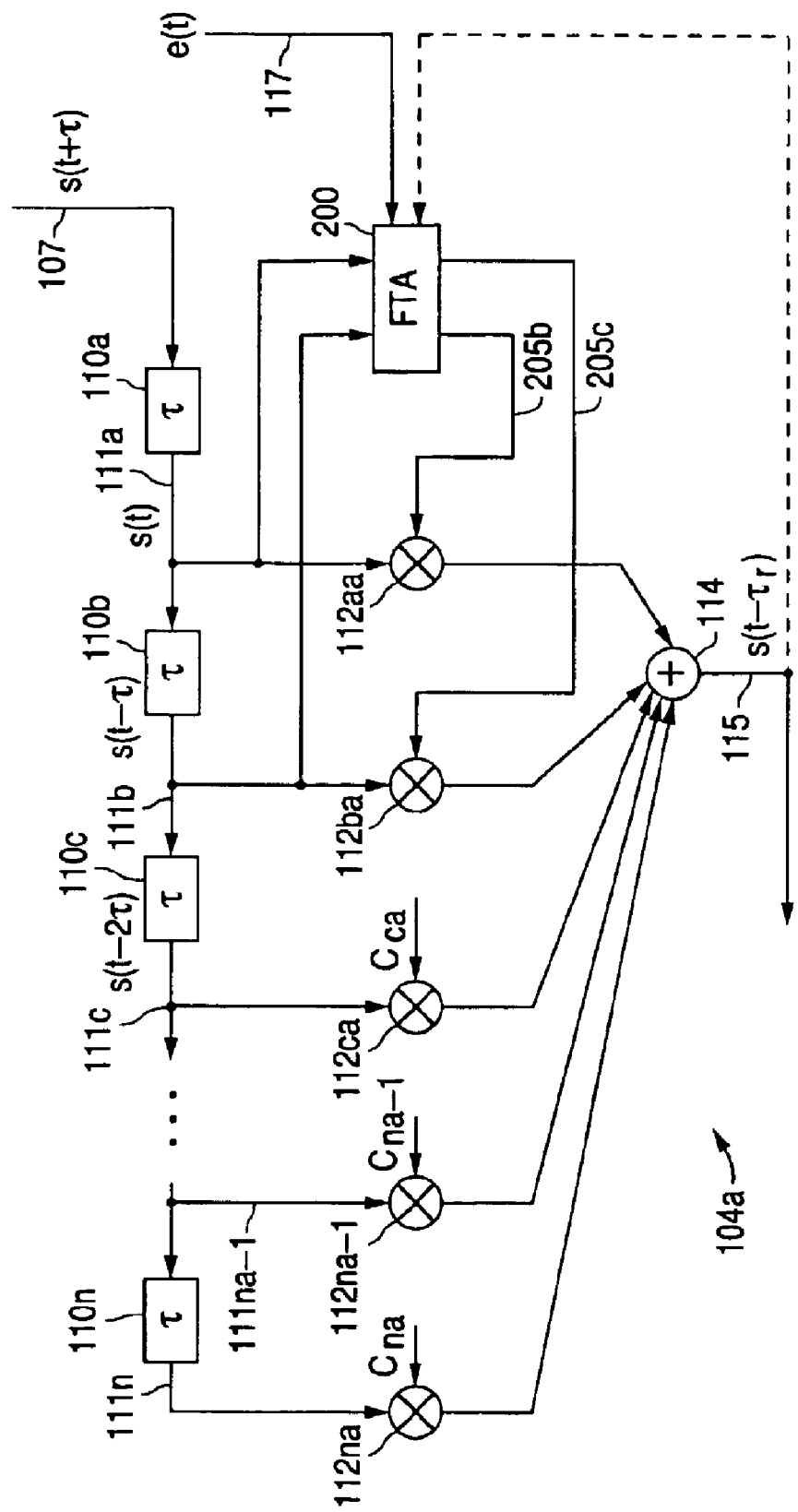
FIG. 2 is a block diagram of the feedback portion of a DFE circuit in which an adaptive coefficient signal generator in accordance with the presently claimed invention is used to provide the adaptive coefficient signals.

Referring to FIG. 2, a feedback filter 104*a* for use in a DFE in a continuous time signal application includes the time delay elements 110 as well as the adaptive gain stages 112. In accordance with the presently claimed invention, each of the time delay elements 110 is a fractional delay element and, therefore, imparts to its data signal a time delay of a fraction of the data symbol, and each of the adaptive gain stages 112 is a multiplier that multiplies its respective time-delayed input signal 111 by one of two adaptive coefficient signals 205*b*, 205*c* (discussed in more detail below). Additionally, a fat tap adaptation (FTA) stage 200 is included. As discussed in more detail below, this FTA stage 200 provides the adaptive coefficient signals 205*b*, 205*c*. In accordance with one embodiment, this FTA stage 200 provides these adaptive coefficient signals 205*b*, 205*c* in accordance with the error signal 117 and the corresponding time-delayed signal 111*a*, 111*b* processed by the related adaptive gain stages 112*aa*, 112*ba*. In accordance with another embodiment, the FTA stage 200 also uses the equalization feedback signal 115.

It should be understood that, in conformance with the discussion herein, additional pairs of adaptive gain stages 112 can also have corresponding FTA stages 200; however, only one such FTA stage 200 is shown in FIG. 2 for purposes of simplified illustration.

By using the adaptive coefficient signals 205*b*, 205*c* provided by the FTA stage 200, adaptive gain stages 112*aa* and 112*ba* operate as correlated taps since adaptive coefficient signals 205*b* and 205*c* are correlated (discussed in more detail below). On the other hand, those among the remaining adaptive gain stages 112*ca*, . . . , 112*na*-1, 112*na* that do not use a corresponding FTA stage 200 are independent taps to the extent that their respective adaptive coefficient signals Cca, . . . , Cna-1, Can are independent, i.e., uncorrelated.

Figure 3:
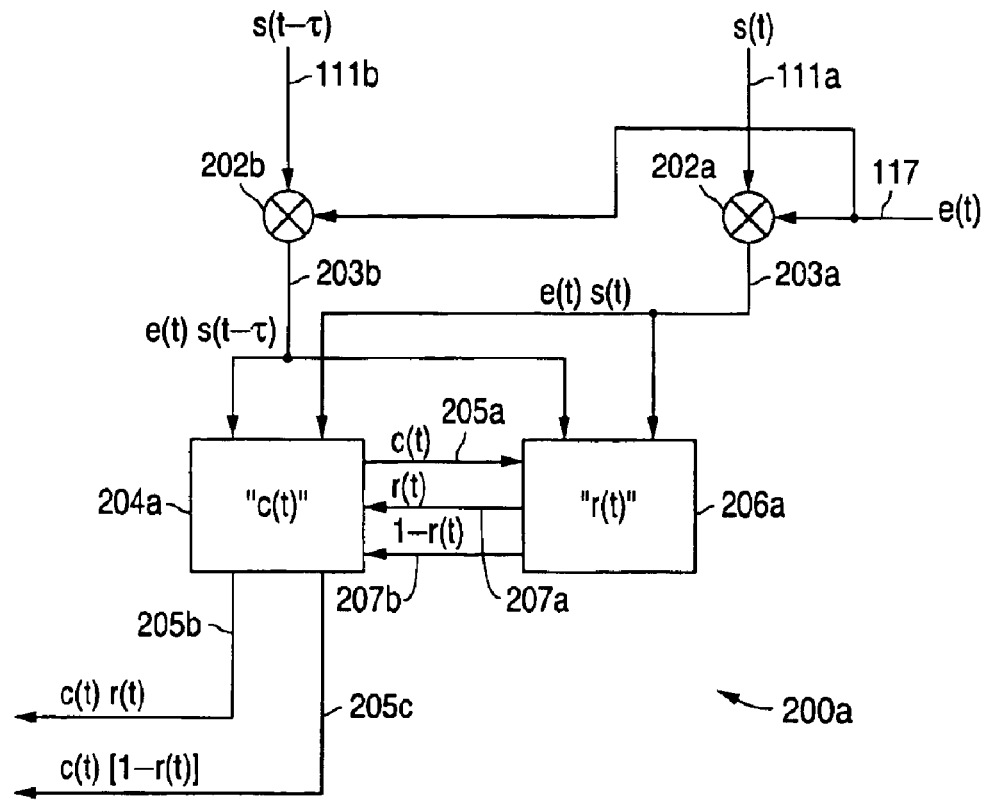
FIG. 3 is a block diagram of one embodiment of an adaptive coefficient signal generator in accordance with the presently claimed invention.

Referring to FIG. 3, one example 200*a* of the FTA stage 200 (FIG. 2) includes multiplier circuits 202*a*, 202*b* and control signal generator circuitry implemented as a coefficient signal generator 204*a* and a timing interpolation parameter signal generator 206*a*, all interconnected substantially as shown. The adjacent time-delayed feedback signals 111*a*, 111*b* are multiplied in their respective multiplier circuits 202*a*, 202*b* with the error signal 117. The resulting product signals 203*a*, 203*b* are processed by the control signal generator circuits 204*a*, 206*a*. As discussed in more detail below, the first control signal generator circuit 204*a* provides an adaptation control signal 205*a* to the second control signal generator circuit 206*a* which, in return, provides two other adaptation control signals 207*a*, 207*b* to the first control signal generator 204*a*. As a result of processing these input signals 203*a*, 203*b*, 207*a*, 207*b*, the first control signal generator circuit 204*a* provides the adaptive coefficient signals c(t)r(t) 205*b*, c(t)(1−r(t)) 205*c*, where signal element c(t) is the weighting factor and signal element r(t) is the factor indicative of the degree of correlation between the adjacent time-delayed feedback signals 111*a*, 111*b*.

Figure 4:
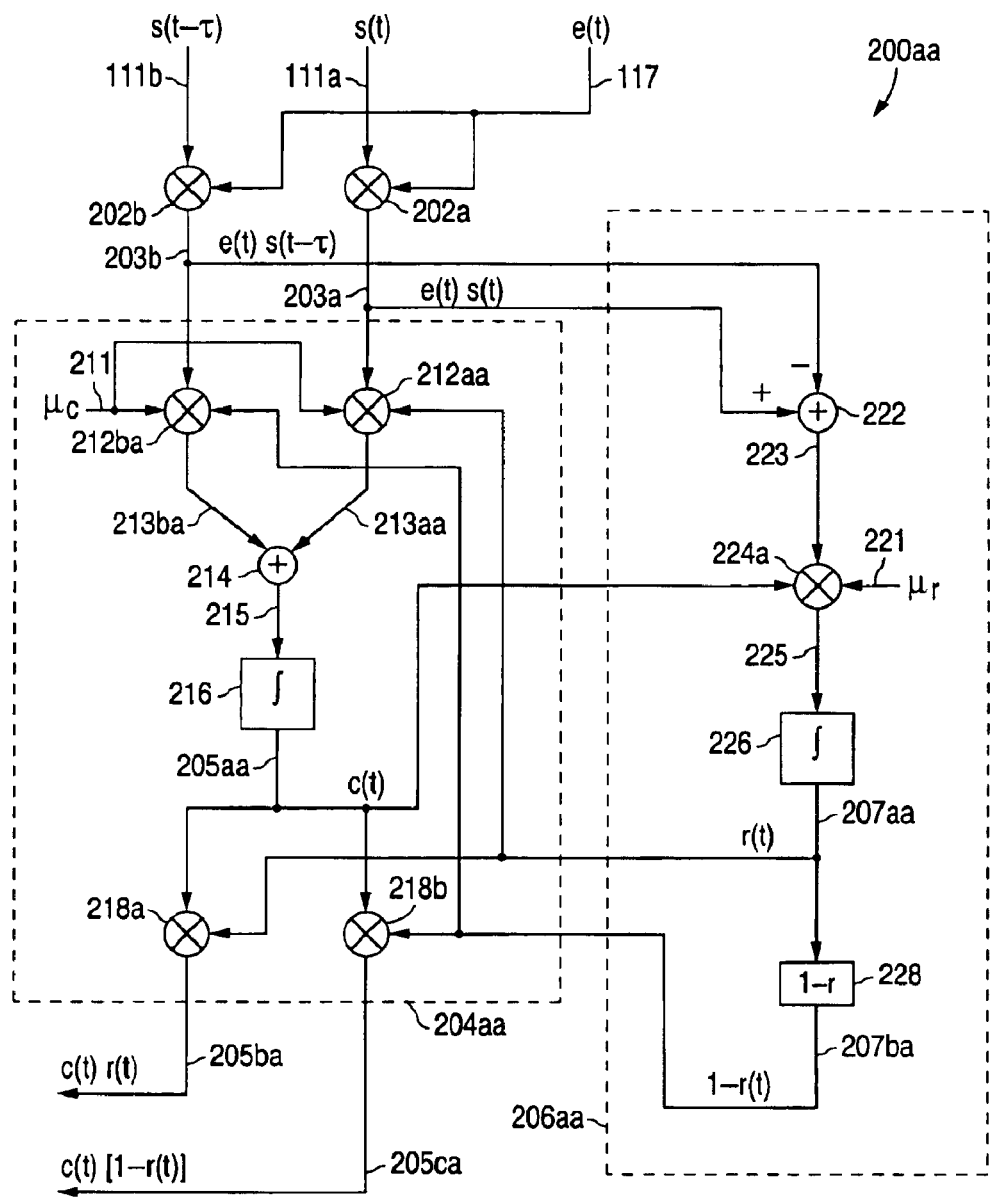
FIG. 4 is a block diagram of an exemplary implementation of the adaptive coefficient signal generator of FIG. 3.

Referring to FIG. 4, one example 200*aa* of the FTA circuit 200*a* of FIG. 3 implements the control signal generators 204*a*, 206*a* substantially as shown. In the first control signal generator 204*aa*, the initial product signals 203*a*, 203*b* are further multiplied in further multiplier circuits 212*aa*, 212*ba* with the adaptation control signals 207*aa*, 207*ba* from the other control signal generator 206*aa*. An additional constant signal 211 can also be multiplied as part of the product operations, or can be implemented as a constant scaling factor within the multiplier circuits 212*aa*, 212*ba*.

The resulting product signal 213*aa*, 213*ba* are summed in a signal summing circuit 214. The resulting sum signal 215 is integrated in an integration circuit 216 (e.g., a low pass filter) to produce the first adaptation control signal 205*aa*. This adaptation control signal 205*aa*, in addition to being provided to the other control signal generator 206*a*, is multiplied within further multiplication circuits 218*a*, 218*b* with the other adaptation control signals 207*aa*, 207*ba* provided by the other control signal generator 206*aa*. The product signals resulting from these multiplication operations are the adaptive coefficient signals 205*ba*, 205*ca*.

In the second control signal generator 206*aa*, the initial product signals 203*a*, 203*b* are differentially summed in a signal summing circuit 222, where the second product signal 203*b* is subtracted from the first product signal 203*a*. The resulting difference signal 223 is multiplied in a multiplier circuit 224*a* with the adaptation control signal 205*aa* provided by the first control signal generator 204*aa*. As with the input multiplier circuits 212*aa*, 212*ba* of the first control signal generator 204*aa*, an additional constant signal 221 can also be used in this multiplication operation, or, alternatively, be implemented as a constant scaling factor within the multiplication circuit 224*a* operation.

The resulting product signal 225 is integrated by another signal integration circuit 226 (e.g., a low pass filter) to produce one of the adaptation control signals 207*aa* used by the first control signal generator 204*aa*.

This adaptation control signal 207*aa* is further processed by a signal complement circuit 228 in which the input signal 207*aa* is subtracted from a reference signal having a normalized value, with the resulting difference signal 207*ba* serving as the other adaptation control signal used by the first control signal generator 204*aa*. For example, if the value of the incoming signal 207*aa* were considered to have a normalized signal value range bounded by the values of zero and unity, the signal complement circuit 228 subtracts the incoming signal 207*aa* from the value of unity to produce the output signal 207*ba*.

Figure 5:
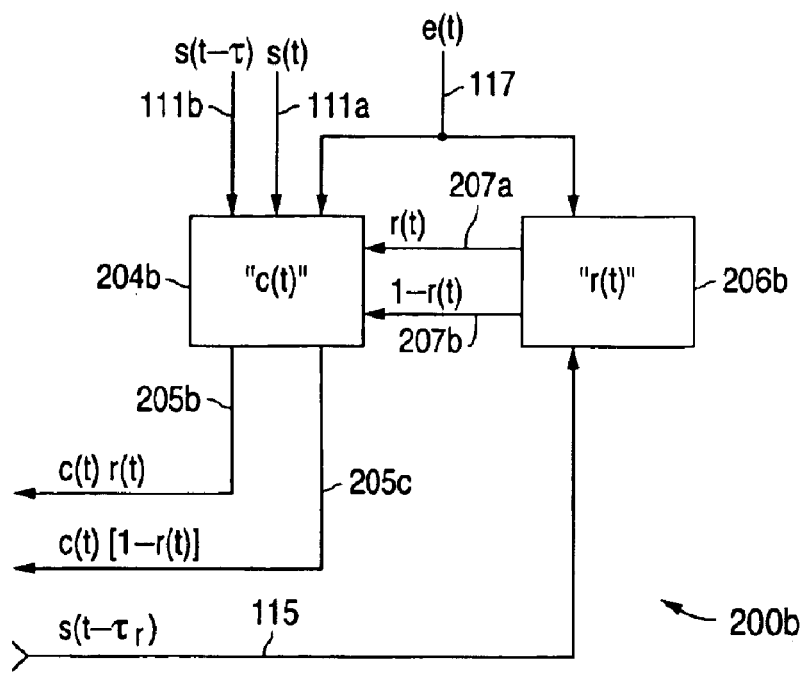
FIG. 5 is a block diagram of another embodiment of an adaptive coefficient signal generator in accordance with the presently claimed invention.

Referring to FIG. 5, another embodiment 200*b* of the FTA circuitry 200 (FIG. 2) uses alternative implementations 204*b*, 206*b* of the control signal generators to process the incoming data signals 111*a*, 111*b*, the error signal 117 and the equalization feedback signal 115.

Figure 6:
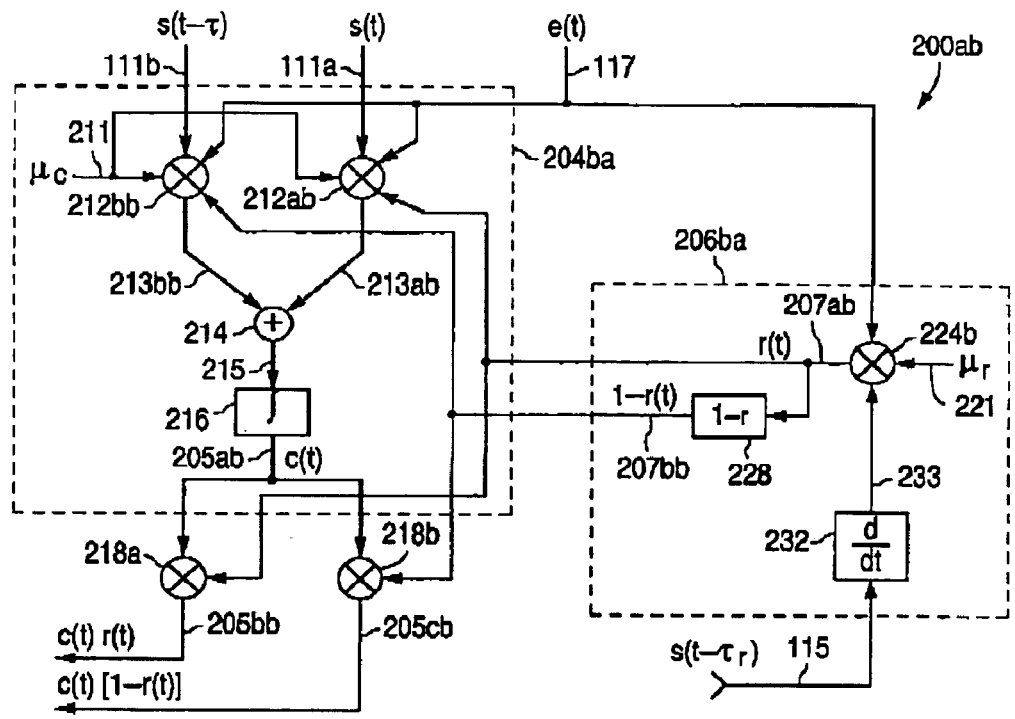
FIG. 6 is a block diagram of an exemplary implementation of the adaptive coefficient signal generator of FIG. 5.

Referring to FIG. 6, one implementation 200*ab* of the FTA circuit 200*b* of FIG. 5 can be implemented substantially as shown. In the first control signal generator 204*ba*, the time-delayed data signals 111*a*, 111*b* and error signal 117 are multiplied in the multiplier circuits 212*ab*, 212*bb* (with the multiplication, or scaling, constant 211 included as part of the operation as discussed above) along with the adaptation control signals 207*ab*, 207*bb* from the other control signal generator 206*ba*. The resulting product signals 213*ab*, 213*bb* are summed in the summing circuit 214. The resulting sum signal 215 is integrated in the signal integration circuit 216 (e.g., a low pass filter) to produce an adaptation control signal 205*ab* (which, in this implementation, is used internally and is not provided to the other control signal generator 206*ba*). This signal 205*ab* is multiplied in output multiplier circuits 218*a*, 218*b* with the adaptation control signals 207*ab*, 207*bb* provided by the other control signal generator 206*ba* to produce the adaptive coefficient signals 205*bb*, 205*cb*.

In the second control signal generator 206*ba*, the equalization feedback signal 115 is differentiated in a signal differentiation circuit 232 (e.g., a high pass filter). The resulting differentiated signal 233 is multiplied in a multiplier circuit 224b with the error signal 117 (with the multiplication, or scaling, constant 221 included as part of the operation as discussed above). The resulting product signal 207ab forms one of the adaptation control signals provided to the first control signal generator 204ba. This signal 207ab is also complemented by the signal complement circuit 228 (as discussed above) to produce the other adaptation control signal 207bb provided to the first control signal generator 204ba.

Figure 7:
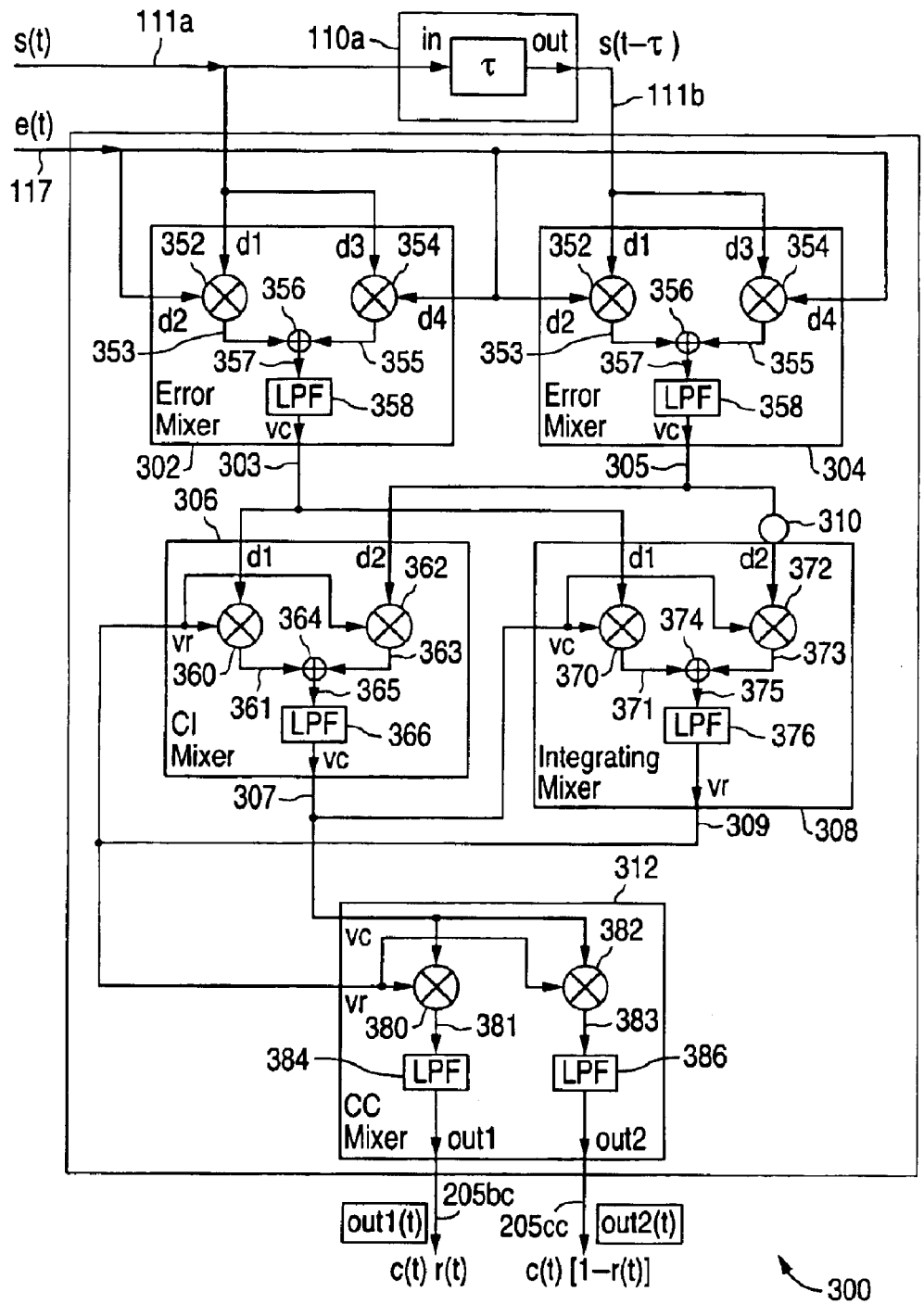
FIG. 7 is a block diagram of an alternative implementation of the adaptive coefficient signal generator of FIG. 4.

Referring to FIG. 7, an adaptive coefficient signal generator in accordance with another embodiment 300 of the presently claimed invention includes error mixer stages 302, 304, a complement integrating mixer stage 306, an integrating mixer stage 308 and a complement coefficient mixer stage 312, all interconnected substantially as shown. The data signals 11a, 111b are received and processed by the error mixer stages 302, 304. Each error mixer stage 302, 304 multiplies these signals 111a, 111b with the error signal 117 in signal multipliers 352, 354. The resulting product signals 353, 355 are summed in a signal combiner 356 and the sum signal 357 is integrated by a signal integration circuit 358 (e.g., a low pass filter).

The signals 303, 305 produced by these mixer stages 302, 304 are further processed by the complement integrating mixer stage 306 and integrating mixer stage 308. The complement integrating mixer 306 multiplies signals 303 and 305 in signal multipliers 360, 362 with the signal 309 produced by the integrating mixer stage 308. The resulting product signals 361, 363 are summed in a signal combiner 364. The sum signal 365 is integrated by a signal integration circuit 366 (e.g., a low pass filter).

The integrating mixer stage 308 multiplies signal 303 and signal 305 (which is inverted by a signal inversion circuit 310) in signal multipliers 370, 372 with the signal 307 produced by the complement integrating mixer stage 306. The resulting product signals 371, 373 are summed in a signal combiner 374. The sum signal 375 is integrated by a signal integration circuit 376 (e.g., a low pass filter).

The signals 307, 309 produced by the complement integrating mixer stage 306 and integrating mixer stage 308 are multiplied in the signal multipliers 380, 382 of the complement coefficient mixer stage 312 with the signal 309 produced by the integrating mixer stage 308. The resulting product signals 381, 383 are integrated in respective signal integration circuits 384, 386 (e.g., low pass filters), thereby producing the adaptive coefficient signals 205bc, 205cc.

Figure 8:
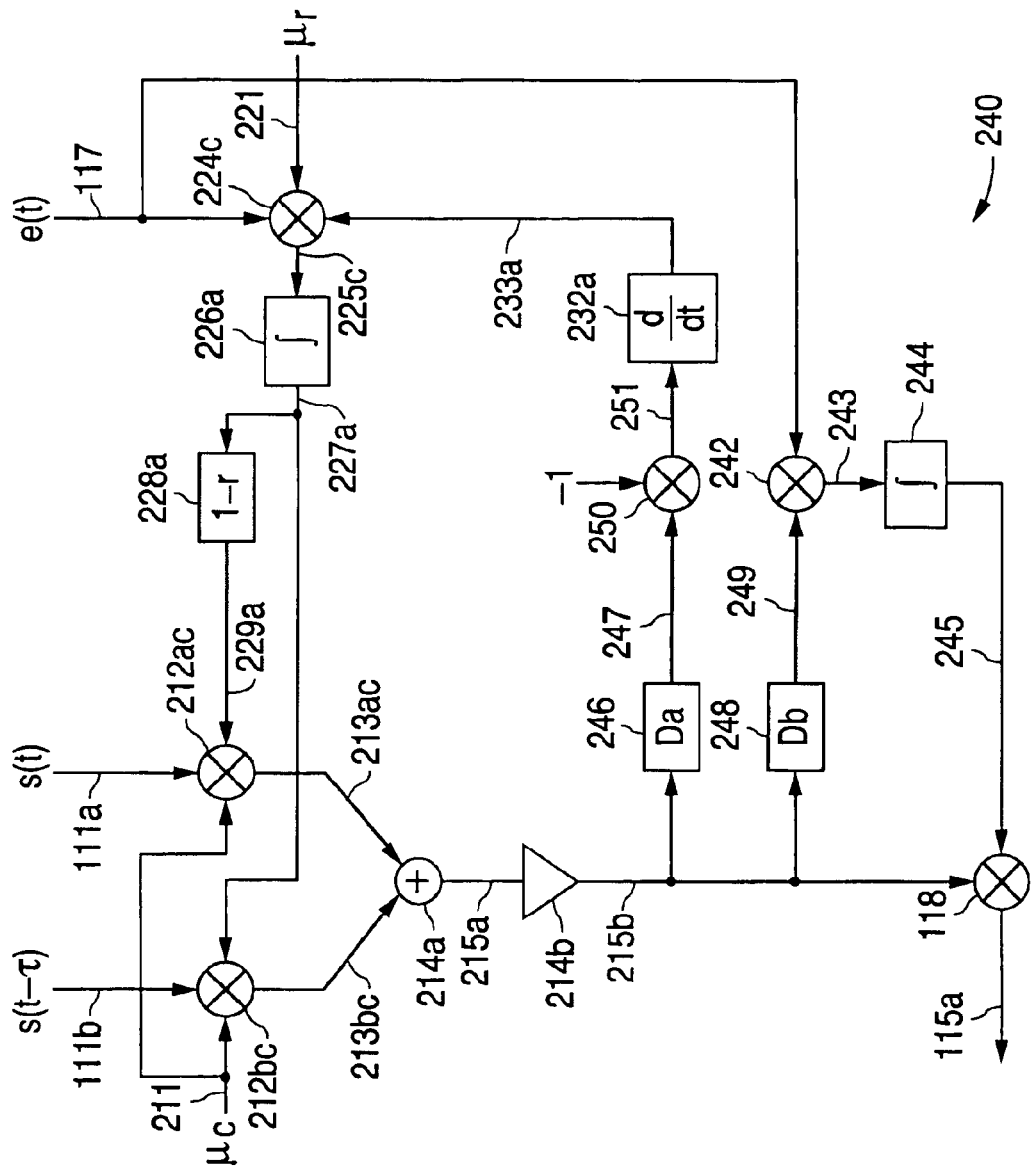
FIG. 8 is a block diagram of an alternative implementation of the adaptive coefficient signal generator of FIG. 6.

Referring to FIG. 8, an adaptive coefficient signal generator in accordance with another embodiment 240 of the presently claimed invention shares some similarities with the implementation shown in FIG. 6. The data signals 11a, 111b are multiplied in multiplier circuits 212ac, 212bc (with a multiplication, or scaling, constant 211 as desired). The resulting product signals 213ac, 213bc are summed in a signal combiner 214a and the sum signal 215a is buffered by a gain stage 214b. The resulting buffered signal 215b is multiplied in a signal multiplier 118 with an integrated signal 245 (discussed in more detail below) to produce the equalization feedback signal 115a, and is also processed by two signal delay stages 246, 248 (discussed in more detail below).

The buffered signal 215b is processed by the first signal delay stage 246, which compensates for signal delays introduced by the signal slicer 106 (FIG. 1), the feedback signal multiplication circuit 118 and the feedback signal summing circuitry 108 (FIG. 1) while subtracting out a delay corresponding to that introduced by the signal inversion circuitry 250 and signal differentiation circuit 232a. The delayed signal 247 is inverted in a signal inversion circuit 250. The inverted signal 251 is differentiated in a signal differentiation circuit 232a (e.g., a high pass filter).

The differentiated signal 233a is multiplied in a signal multiplier 224c with the error signal 117 (along with a multiplication, or scaling, constant 221 as desired). The resulting product signal 225c is integrated in a signal integration circuit 226a (e.g., a low pass filter) to produce the adaptation control signal 227a for signal multiplier 212bc. This signal 227a is also complemented by a signal complement circuit 228a (as discussed above) to produce the other adaptation control signal 229a for signal multiplier 212ac.

The second signal delay stage 248 compensates for signal delays introduced by the signal slicer 106 (FIG. 1), the feedback multiplier 118 and feedback signal summer 108 (FIG. 1). The resulting delayed signal 249 is multiplied in a signal multiplier 242 with the error signal 117. The resulting product signal 243 is integrated in a signal integration circuit 244 (e.g., a low pass filter). The integrated signal 245 is multiplied with the buffered signal 215b in the feedback signal multiplier 118 to produce the equalization feedback signal 115a.

Figure 9:
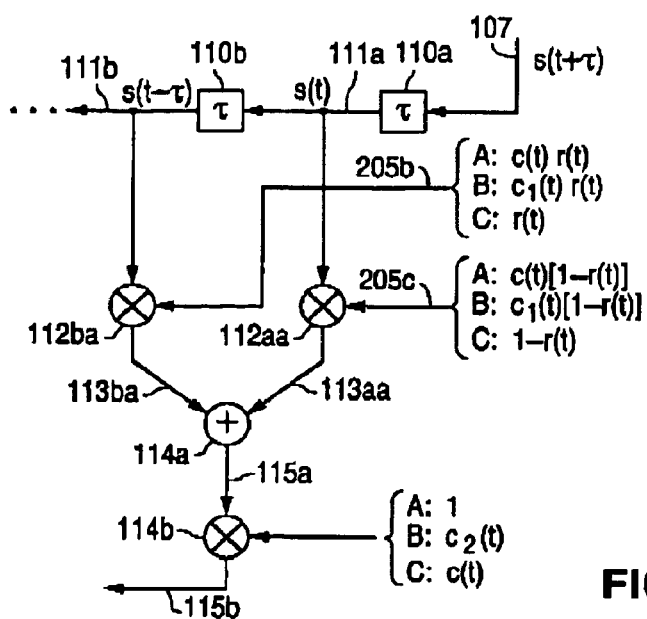
FIG. 9 is a block diagram depicting signal adaptation using correlated taps in accordance with another embodiment of the presently claimed invention.

Referring to FIG. 9, the adaptive coefficient signals as discussed above can be used in an adaptive signal equalizer with fractionally-spaced feedback in a number of ways. As discussed above, the data signals 111a, 111b are multiplied in signal multipliers 112aa, 112ba with the adaptive coefficient signals 205b, 205c, with the resulting product signals 113aa, 113ba combined in a signal combiner 114a to produce a signal 115a which may or may not be the final equalization feedback signal (discussed in more detail below). For example, in scenario A, the first adaptation control signal 205b corresponds to a product of a weighting factor c(t) and the correlation factor r(t), while the second adaptation control signal 205c corresponds to a product of the weighting factor c(t) and the complement [1−r(t)] of the correlation factor r(t). The sum signal 115a can be used directly as the final equalization feedback signal or can be further scaled (e.g., multiplied by a value of unity) in the output multiplier 114b to produce the final equalization feedback signal 115b.

In scenario B, the first adaptation control signal 205b corresponds to a product of a partial weighting factor $c_1(t)$ and the correlation factor r(t), while the second adaptation control signal 205c corresponds to a product of the partial weighting factor $c_1(t)$ and the complement [1−r(t)] of the correlation factor r(t). The sum signal 115a is multiplied in the multiplier 114b by a final weighting factor $c_2(t)$ to produce the final equalization feedback signal 115b.

In scenario C, the first adaptation control signal 205b corresponds to the correlation factor r(t), while the second adaptation control signal 205c corresponds to the complement [1−r(t)] of the correlation factor r(t). The sum signal 115a is multiplied in the output multiplier 114b by the weighting factor c(t) to produce the final equalization feedback signal 115b.

A number of enhancements or modifications may be used to improve the performance over the IFTA with two taps within the fat tap.

Fixed Ratio Fat Tap with Hypothesis Testing

In this modification, adaptation of r may not occur in a continuous-time basis. One tap in the fat tap may be set to be at c with LMS adaptation (discrete-time or continuous-time), while the coefficient of the other tap within the fat tap is related to the first tap coefficient as a multiple by a correlation parameter (of the form $$r_1(t) = \mu_r \cdot \int_0^t e(v) \cdot \frac{df_i(v)}{dv} dv$$

$$r_2(t) = \mu_r \cdot \int_0^t e(v) \cdot \frac{df(v)}{dv} dv$$

$$\frac{1-r}{r}$$

as described above). A discrete set of such hypotheses corresponding to different values of the correlation parameter $$\frac{1-r}{r}$$

may be assumed. Each hypothesis is tested and the different taps, which may be LMS-adaptable, are adapted and, after convergence, the steady-state mean square error and/or the adapted filter coefficients may be used to decide on the right hypothesis (the right hypothesis may be selected to be the one with minimum MSE and/or acceptable patterns within the tap coefficients).

Multi-Tap Fat Tap with Linear Interpolation

Multiple taps (more than two) and/or a variable number of taps may be used within a fat tap. A simple but effective approach here is to do multiple stages of linear interpolation, each stage consisting of a linear interpolation between some two points obtained from the earlier stage to give one new point which may be used in the next stage. The multi-tap fat tap will then have more than two parameters to adapt.

As an example, consider three feedback taps within a fat tap with input signals $s(t), s(t-\tau), s(t-2\tau)$. Then, $s(t-\tau_{r_1}) = r_1 \cdot s(t) + (1-r_1) \cdot s(t-\tau)$ may first be formed as a linear interpolation of $s(t), s(t-\tau)$, and then $s(t-\tau_{r_2}) = r_2 \cdot s(t-\tau_{r_1}) + (1-r_2) \cdot s(t-2\tau)$ is expected to be the symbol-spaced feedback signal. The feedback tap coefficients for the fat tap with input signals $s(t), s(t-\tau), s(t-2\tau)$ are then $c \cdot r_1 \cdot r_2, c \cdot (1-r_1) \cdot r_2, c \cdot (1-r_2)$. The adaptation updates of the 3 parameters $r_1, r_2, c$ in the continuous-time domain are as follows:

$$c(t) =$$
$$\mu_c \cdot \int_0^t e(v) \cdot [r_1 \cdot r_2 \cdot s(v) + (1-r_1) \cdot r_2 \cdot s(v-\tau) + (1-r_2) \cdot s(v-2\cdot\tau)] dv$$

$$r_1(t) = \mu_r \cdot \int_0^t c(v) \cdot r_2(v) \cdot e(v) \cdot [s(v) - s(v-\tau)] dv$$

$$r_2(t) = \mu_r \cdot \int_0^t c(v) \cdot e(v) \cdot [r_1 \cdot s(v) + (1-r_1) \cdot s(v-\tau) - s(v-2\cdot\tau)] dv$$

Knowing a priori the signs of $c, r_2$ the above equations may be simplified. With an intermediate output of the fat tap defined as $$f_i(t) = c \cdot r_1 \cdot r_2 s(t) + c \cdot (1-r_1) \cdot r_2 s(t-\tau),$$

and the final output as $$f(t) = f_i(t) + c \cdot (1-r_2) \cdot s(t-2\cdot\tau),$$

then the following simplified update equations result:

Note that $$\frac{df_i(v)}{dv}, \frac{df(v)}{dv}$$

may easily be implemented by passing the outputs of the fat tap $f_i(t), f(t)$ through the C-R differentiator block, which is a high-pass filter.

Multi-Tap Fat Tap with Superlinear Interpolation

More general interpolation can also be employed, especially when more than two taps are included within the fat tap, such as quadratic interpolation. For example, with three feedback taps within a fat tap and with input signals $s(t), s(t-\tau), s(t-2\cdot\tau)$, the corresponding tap coefficients may be given as $c \cdot f_0(r), c \cdot f_1(r), c \cdot f_2(r)$ for some appropriately selected functions $f_0(\cdot), f_1(\cdot), f_2(\cdot)$, which in general may also be functions of more than one parameter. The adaptation updates are then given as:

$$c(t) = \mu_c \cdot \int_0^t e(v) \cdot [f_0(r) \cdot s(v) + f_1(r) \cdot s(v-\tau) + f_2(r) \cdot s(v-2\cdot\tau)] dv$$

$$\frac{d}{dt} r(t) = c(t) \cdot e(t) \cdot [f_0'(r) \cdot s(t) + f_1'(r) \cdot s(t-\tau) + f_2'(r) \cdot s(t-2\cdot\tau)]$$

which may be approximated by the following explicit update equation for r(t):

$$r(t) = \mu_r \cdot \int_0^t c(v) \cdot e(v) \cdot [f_0'(r) \cdot s(v) + f_1'(r) \cdot s(v-\tau) + f_2'(r) \cdot s(v-2\cdot\tau)] dv$$

Fat Tap with Gain Offset

To compensate for a residual but unknown gain offset between the taps in a fat tap or to control the linearity range, a fat tap with gain offset may be used. For example, consider two feedback taps within a fat tap with input signals $s(t), s(t-\tau)$. The tap coefficients for these two taps are then respectively $c \cdot r, c \cdot a \cdot (1-r)$. The adaptation updates for the three parameters (c, a, r) are then given as:

$$c(t) = \mu_c \cdot \int_0^t e(v) \cdot [r \cdot s(v) + a \cdot (1-r) \cdot s(v-\tau)] dv$$

$$r(t) = \mu_r \cdot \int_0^t c(v) \cdot e(v) \cdot [s(v) - a \cdot s(v-\tau)] dv$$

$$a(t) = \mu_c \cdot \int_0^t c(v) \cdot e(v) \cdot (1-r) \cdot s(v-\tau) dv$$

Correlated Fat Tap Adaptation (CFTA

Multiple fat taps may share one or more taps such that each tap could correspond to more than one symbol (e.g., two symbols). It would then be expected that a set of fat taps together emulate multiple symbol-spaced feedback taps. For example, consider three feedback taps with input signals $s(t), s(t-\tau), s(t-2\cdot\tau)$ such that these together could correspond to two symbol-spaced feedback taps. The first fat tap which corresponds to the first past symbol consists of the feedback taps with inputs s(t),s(t−τ), and the second fat tap corresponds to the second past symbol and consists of the feedback taps with inputs s(t−τ),s(t−2·r); thus, the fat taps have an overlapping feedback tap. The feedback tap coefficients may then be expressed as $c_1 \cdot r_1$, $c_1 \cdot (1-r_1)+c_2 \cdot r_2, c_2 \cdot (1-r_2)$.

The update equations for $c_1, c_2, r_1, r_2$ are similarly expressed as follows:

$$c_1(t) = \mu_c \cdot \int_0^t e(v) \cdot [r_1 \cdot s(v) + (1-r_1) \cdot s(v-\tau)] dv$$

$$r_1(t) = \mu_r \cdot \int_0^t c_1(v) \cdot e(v) \cdot [s(v) - s(v-\tau)] dv$$

$$c_2(t) = \mu_c \cdot \int_0^t e(v) \cdot [r_2 \cdot s(v) + (1-r_2) \cdot s(v-\tau)] dv$$

$$r_2(t) = \mu_r \cdot \int_0^t c_2(v) \cdot e(v) \cdot [s(v) - s(v-\tau)] dv.$$

Quasi-LMSE-Based Adaptation Schemes for Fat Tap Interpolating Mixer

Other adaptation techniques for controlling the timing control ratio parameter in the interpolating mixer within the Fat Tap may also be used. One such technique may include the use of tap coefficients on the feedforward/feedback equalizers which adapt based on LMSE, in a manner that this approximates LMSE-based adaptation for the timing control ratio parameter. Thus, if the feedforward tap coefficients within the Fat Tap are of the form $\{c_i\}_{i=0}^L$, two alternative manners of adapting the timing control ratio are provided below:

$$r = \mu \cdot \int_0^t (\sum_{i=0}^L w_i \cdot c_i) dt \text{ or alternatively } r = \mu \cdot \int_0^t (\sum_{i=0}^L \sum_{j=0}^L w_{i,j} \cdot c_i \cdot c_j) dt$$

for appropriately selected adaptation parameter: $\mu$ and real number weights $\{w_i\}_{i=0}^L$ or $$\{w_{i,j}\}_{i,j=0}^{i,j=L}.$$

Yet another technique for adapting the timing control ratio parameter may be using the eye monitor test.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including an adaptive coefficient signal generator for use in an adaptive signal equalizer with fractionally-spaced feedback and in which an adaptively equalized data signal forms a pre-slicer data signal that is sliced to provide a post-slicer data signal, comprising:

first signal multiplication circuitry that receives and multiplies a plurality of multiplicand signals to provide a plurality of interim product signals and a plurality of final product signals, wherein said plurality of multiplicand signals comprises
  a first data signal corresponding to a post-slicer data signal and having a data symbol period associated therewith,
  a second data signal corresponding to said first data signal and delayed by a fraction of said data symbol period,
  an error signal corresponding to a difference between said post-slicer data signal and a pre-slicer data signal,
  a first adaptation control signal having a first value bounded by lower and upper values, and
  a second adaptation control signal having a second value related to a difference between a normalized value and said first value, said plurality of interim product signals comprises
  a first interim product signal corresponding to a product of said first data signal and said error signal, and
  a second interim product signal corresponding to a product of said second data signal and said error signal, and said plurality of final product signals comprises
  a first final product signal corresponding to a product of said first interim product signal and said first adaptation control signal, and
  a second final product signal corresponding to a product of said second interim product signal and said second adaptation control signal;

first signal combining circuitry, coupled to said first signal multiplication circuitry, that receives and combines said plurality of final product signals to provide a first combined signal;

first signal integration circuitry, coupled to said first signal combining circuitry, that receives and integrates said first combined signal to provide a third adaptation control signal;

second signal multiplication circuitry, coupled to said first signal integration circuitry, that receives and multiplies said first, second and third adaptation control signals to provide a plurality of adaptive coefficient signals;

second signal combining circuitry, coupled to said first signal multiplication circuitry, that receives and combines said plurality of interim product signals to provide a second combined signal;

third signal multiplication circuitry, coupled to said first signal integration circuitry and said second, signal combining circuitry, that receives and multiplies said third adaptation control signal and said second combined signal to provide another product signal;

second signal integration circuitry, coupled to said first signal multiplication circuitry, said second signal multiplication circuitry and said third signal multiplication circuitry, that receives and integrates said another product signal to provide said first adaptation control signal; and signal complement circuitry, coupled to said first signal multiplication circuitry, said second signal multiplication circuitry and said second signal integration circuitry, that receives and complements said first adaptation control signal to provide said second adaptation control signal.

2. The apparatus of claim 1, further comprising:

fractionally-spaced feedback circuitry, coupled to said first signal multiplication circuitry, that receives said post-slicer data signal and in response thereto provides said first and second data signals; and fourth signal multiplication circuitry, coupled to said fractionally-spaced feedback circuitry and said second signal multiplication circuitry, that receives and multiplies said first and second data signals and said plurality of adaptive coefficient signals to provide a plurality of adaptive feedback signals;

wherein said second data signal is caused to appear delayed by a time interval substantially equal to said data symbol period such that said fractionally-spaced feedback circuitry emulates symbol-spaced feedback circuitry.

3. The apparatus of claim 1, wherein said first signal combining circuitry comprises signal summing circuitry that sums said plurality of final product signals to provide a sum signal as said first combined signal.

4. The apparatus of claim 1, wherein said first signal integration circuitry comprises low pass filter circuitry that low pass filters said first combined signal to provide a low pass filtered signal as said third adaptation control signal.

5. The apparatus of claim 1, wherein said second signal combining circuitry comprises signal subtraction circuitry that subtracts one of said plurality of interim product signals from another of said plurality of interim product signals to provide a difference signal as said second combined signal.

6. The apparatus of claim 1, wherein said second signal integration circuitry comprises low pass filter circuitry that low pass filters said another product signal to provide a low pass filtered signal as said first adaptation control signal.

7. The apparatus of claim 1, wherein said signal complement circuitry comprises signal subtraction circuitry that subtracts said first adaptation control signal from a reference signal having said normalized value to provide a difference signal as said second adaptation control signal.

8. An apparatus including an adaptive coefficient signal generator for use in an adaptive signal equalizer with fractionally-spaced feedback and in which an adaptively equalized data signal forms a pre-slicer data signal that is sliced to provide a post-slicer data signal, comprising:

first signal multiplication circuitry that receives and multiplies a plurality of multiplicand signals to provide a first plurality of product signals, wherein said plurality of multiplicand signals comprises
a first data signal corresponding to a post-slicer data signal and having a data symbol period associated therewith,
a second data signal corresponding to said first data signal and delayed by a fraction of said data symbol period, and
an error signal corresponding to a difference between said post-slicer data signal and a pre-slicer data signal, and said first plurality of product signals comprises
a first product signal corresponding to a product of said first data signal and said error signal, and
a second product signal corresponding to a product of said second data signal and said error signal;

first control signal generator circuitry, coupled to said first signal multiplication circuitry, that receives and processes said first plurality of product signals and first and second adaptation control signals and in response thereto provides a plurality of adaptive coefficient signals and a third adaptation control signal related to one of said plurality of adaptive coefficient signals; and second control signal generator circuitry, coupled to said first signal multiplication circuitry and said first control signal generator circuitry, that receives and processes said first plurality of product signals and said third adaptation control signal and in response thereto provides said first and second adaptation control signals.

9. The apparatus of claim 8, further comprising:

fractionally-spaced feedback circuitry, coupled to said first signal multiplication circuitry, that receives said post-slicer data signal and in response thereto provides said first and second data signals; and second signal multiplication circuitry, coupled to said fractionally-spaced feedback circuitry and said first control signal generator circuitry, that receives and multiplies said first and second data signals and said plurality of adaptive coefficient signals to provide a plurality of adaptive feedback signals;

wherein said second data signal is caused to appear delayed by a time interval substantially equal to said data symbol period such that said fractionally-spaced feedback circuitry emulates symbol-spaced feedback circuitry.

10. The apparatus of claim 8, wherein:

said first adaptation control signal has a first value bounded by lower and upper values; and said second adaptation control signal has a second value related to a difference between a normalized value and said first value.

11. The apparatus of claim 8, wherein said first control signal generator circuitry comprises:

second signal multiplication circuitry that receives and multiplies said first plurality of product signals and said first and second adaptation control signals to provide a second plurality of product signals comprising
a third product signal corresponding to a product of said first product signal and said first adaptation control signal, and
a fourth product signal corresponding to a product of said second product signal and said second adaptation control signal;

signal combining circuitry, coupled to said second signal multiplication circuitry, that receives and combines said second plurality of product signals to provide a combined signal;

signal integration circuitry, coupled to said signal combining circuitry, that receives and integrates said combined signal to provide said third adaptation control signal; and third signal multiplication circuitry, coupled to said signal integration circuitry, that receives and multiplies said first, second and third adaptation control signals to provide said plurality of adaptive coefficient signals.

12. The apparatus of claim 11, wherein said signal combining circuitry comprises signal summing circuitry that sums said second plurality of product signals to provide a sum signal as said combined signal.

13. The apparatus of claim 11, wherein said signal integration circuitry comprises low pass filter circuitry that low pass filters said combined signal to provide a low pass filtered signal as said third adaptation control signal.

14. The apparatus of claim 8, wherein said second control signal generator circuitry comprises:

signal combining circuitry, coupled to said first signal multiplication circuitry, that receives and combines said first plurality of product signals to provide a combined signal;

second signal multiplication circuitry, coupled to said signal combining circuitry, that receives and multiplies said third adaptation control signal and said combined signal to provide a third product signal;

signal integration circuitry, coupled to said second signal multiplication circuitry, that receives and integrates said third product signal to provide said first adaptation control signal; and signal complement circuitry, coupled to said signal integration circuitry, that receives and complements said first adaptation control signal to provide said second adaptation control signal.

15. The apparatus of claim 14, wherein said signal combining circuitry comprises signal subtraction circuitry that subtracts one of said first plurality of product signals from another of said first plurality of product signals to provide a difference signal as said combined signal.

16. The apparatus of claim 14, wherein said signal integration circuitry comprises low pass filter circuitry that low pass filters said third product signal to provide a low pass filtered signal as said first adaptation control signal.

17. The apparatus of claim 14, wherein said signal complement circuitry comprises signal subtraction circuitry that subtracts said first adaptation control signal from a reference signal having a normalized value to provide a difference signal as said second adaptation control signal.

18. An apparatus including an adaptive coefficient signal generator for use in an adaptive signal equalizer with fractionally-spaced feedback and in which an equalization feedback signal adaptively equalizes a data signal to form a pre-slicer data signal that is sliced to provide a post-slicer data signal, comprising:

first signal multiplication circuitry that receives and multiplies a plurality of multiplicand signals to provide a plurality of product signals, wherein
    said plurality of multiplicand signals comprises
        a first data signal corresponding to a post-slicer data signal and having a data symbol period associated therewith,
        a second data signal corresponding to said first data signal and delayed by a fraction of said data symbol period,
        an error signal corresponding to a difference between said post-slicer data signal and a pre-slicer data signal,
        a first adaptation control signal having a first value bounded by lower and upper values, and
        a second adaptation control signal having a second value related to a difference between a normalized value and said first value, and
    said plurality of product signals comprises
        a first product signal corresponding to a product of said first data signal, said error signal and said first adaptation control signal, and
        a second product signal corresponding to a product of said second data signal, said error signal and said second adaptation control signal;

first signal combining circuitry, coupled to said first signal multiplication circuitry, that receives and combines said plurality of product signals to provide a first combined signal;

signal integration circuitry, coupled to said first signal combining circuitry, that receives and integrates said first combined signal to provide a third adaptation control signal;

second signal multiplication circuitry, coupled to said signal integration circuitry, that receives and multiplies said first, second and third adaptation control signals to provide a plurality of adaptive coefficient signals;

signal differentiation circuitry that receives and differentiates an equalization feedback signal to provide a differentiated signal;

third signal multiplication circuitry, coupled to said first signal multiplication circuitry, said second signal multiplication circuitry and signal differentiation circuitry, that receives and multiplies said error signal and said differentiated signal to provide said first adaptation control signal; and signal complement circuitry, coupled to said first signal multiplication circuitry, said second signal multiplication circuitry and said third signal multiplication circuitry, that receives and complements said first adaptation control signal to provide said second adaptation control signal.

19. The apparatus of claim 18, further comprising:

fractionally-spaced feedback circuitry, coupled to said first signal multiplication circuitry, that receives said post-slicer data signal and in response thereto provides said first and second data signals;

fourth signal multiplication circuitry, coupled to said fractionally-spaced feedback circuitry and said second signal multiplication circuitry, that receives and multiplies said first and second data signals and said plurality of adaptive coefficient signals to provide a plurality of adaptive feedback signals; and second signal combining circuitry, coupled to said fourth signal multiplication circuitry and said signal differentiation circuitry, that receives and combines said plurality of adaptive feedback signals to provide said equalization feedback signal;

wherein said second data signal is caused to appear delayed by a time interval substantially equal to said data symbol period such that said fractionally-spaced feedback circuitry emulates symbol-spaced feedback circuitry.

20. The apparatus of claim 18, wherein said first signal combining circuitry comprises signal summing circuitry that sums said plurality of product signals to provide a sum signal as said first combined signal.

21. The apparatus of claim 18, wherein said first signal integration circuitry comprises low pass filter circuitry that low pass filters said first combined signal to provide a low pass filtered signal as said third adaptation control signal.

22. The apparatus of claim 18, wherein said signal differentiation circuitry comprises high pass filter circuitry that high pass filters said equalization feedback signal to provide a high pass filtered signal as said differentiated signal.

23. The apparatus of claim 18, wherein said signal complement circuitry comprises signal subtraction circuitry that subtracts said first adaptation control signal from a reference signal having said normalized value to provide a difference signal as said second adaptation control signal.

24. An apparatus including an adaptive coefficient signal generator for use in an adaptive signal equalizer with fractionally-spaced feedback and in which an equalization feedback signal adaptively equalizes a data signal to form a pre-slicer data signal that is sliced to provide a post-slicer data signal, comprising:

first control signal generator circuitry that receives and processes a plurality of input signals and first and second adaptation control signals and in response thereto provides a plurality of adaptive coefficient signals, wherein said plurality of input signals comprises
    a first data signal corresponding to a post-slicer data signal and having a data symbol period associated therewith,
    a second data signal corresponding to said first data signal and delayed by a fraction of said data symbol period, and an error signal corresponding to a difference between said post-slicer data signal and a pre-slicer data signal; and second control signal generator circuitry, coupled to said first control signal generator circuitry, that receives and processes said error signal and an equalization feedback signal and in response thereto provides said first and second adaptation control signals.

25. The apparatus of claim 24, further comprising:

fractionally-spaced feedback circuitry, coupled to said first control signal generator circuitry, that receives said post-slicer data signal and in response thereto provides said first and second data signals;

signal multiplication circuitry, coupled to said fractionally-spaced feedback circuitry and said first control signal generator circuitry, that receives and multiplies said first and second data signals and said plurality of adaptive coefficient signals to provide a plurality of adaptive feedback signals; and signal combining circuitry, coupled to said signal multiplication circuitry and said second control signal generator circuitry, that receives and combines said plurality of adaptive feedback signals to provide said equalization feedback signal;

wherein said second data signal is caused to appear delayed by a time interval substantially equal to said data symbol period such that said fractionally-spaced feedback circuitry emulates symbol-spaced feedback circuitry.

26. The apparatus of claim 24, wherein:

said first adaptation control signal has a first value bounded by lower and upper values; and said second adaptation control signal has a second value related to a difference between a normalized value and said first value.

27. The apparatus of claim 24, wherein said first control signal generator circuitry comprises:

first signal multiplication circuitry that receives and multiplies said plurality of input signals and said first and second adaptation control signals to provide a plurality of product signals comprising a first product signal corresponding to a product of said first data signal, said error signal and said first adaptation control signal, and a second product signal corresponding to a product of said second data signal, said error signal and said second adaptation control signal;

signal combining circuitry, coupled to said signal multiplication circuitry, that receives and combines said plurality of product signals to provide a combined signal;

signal integration circuitry, coupled to said signal combining circuitry, that receives and integrates said combined signal to provide a third adaptation control signal; and second signal multiplication circuitry, coupled to said signal integration circuitry, that receives and multiplies said first, second and third adaptation control signals to provide said plurality of adaptive coefficient signals.

28. The apparatus of claim 27, wherein said signal combining circuitry comprises signal summing circuitry that sums said second plurality of product signals to provide a sum signal as said combined signal.

29. The apparatus of claim 27, wherein said signal integration circuitry comprises low pass filter circuitry that low pass filters said combined signal to provide a low pass filtered signal as said third adaptation control signal.

30. The apparatus of claim 24, wherein said second control signal generator circuitry comprises:

signal differentiation circuitry that receives and differentiates said equalization feedback signal to provide a differentiated signal;

signal multiplication circuitry, coupled to said signal differentiation circuitry, that receives and multiplies said error signal and said differentiated signal to provide said first adaptation control signal; and signal complement circuitry, coupled to said signal multiplication circuitry, that receives and complements said first adaptation control signal to provide said second adaptation control signal.

31. The apparatus of claim 30, wherein said signal differentiation circuitry comprises high pass filter circuitry that high pass filters said equalization feedback signal to provide a high pass filtered signal as said differentiated signal.

32. The apparatus of claim 30, wherein said signal complement circuitry comprises signal subtraction circuitry that subtracts said first adaptation control signal from a reference signal having a normalized value to provide a difference signal as said second adaptation control signal.

33. An apparatus including an adaptive coefficient signal generator for use in an adaptive signal equalizer with fractionally-spaced feedback and in which an adaptively equalized data signal forms a pre-slicer data signal that is sliced to provide a post-slicer data signal, comprising:

first multiplier means for receiving and multiplying a plurality of multiplicand signals and providing a plurality of interim product signals and a plurality of final product signals, wherein said plurality of multiplicand signals comprises a first data signal corresponding to a post-slicer data signal and having a data symbol period associated therewith, a second data signal corresponding to said first data signal and delayed by a fraction of said data symbol period, an error signal corresponding to a difference between said post-slicer data signal and a pre-slicer data signal, a first adaptation control signal having a first value bounded by lower and upper values, and a second adaptation control signal having a second value related to a difference between a normalized value and said first value, said plurality of interim product signals comprises a first interim product signal corresponding to a product of said first data signal and said error signal, and a second interim product signal corresponding to a product of said second data signal and said error signal, and said plurality of final product signals comprises a first final product signal corresponding to a product of said first interim product signal and said first adaptation control signal, and a second final product signal corresponding to a product of said second interim product signal and said second adaptation control signal;

first combiner means for combining said plurality of final product signals and providing a first combined signal;

first integrator means for integrating said first combined signal and providing a third adaptation control signal;

second multiplier means for multiplying said first, second and third adaptation control signals and providing a plurality of adaptive coefficient signals;

second combiner means for combining said plurality of interim product signals and providing a second combined signal;

third multiplier means for multiplying said third adaptation control signal and said second combined signal and providing another product signal;

second integrator means for integrating said another product signal and providing said first adaptation control signal; and complement means for complementing said first adaptation control signal and providing said second adaptation control signal.

34. The apparatus of claim 33, further comprising:

feedback means for delaying said post-slicer data signal in a successively fractionally-spaced manner and providing said first and second data signals; and fourth multiplier means for multiplying said first and second data signals and said plurality of adaptive coefficient signals and providing a plurality of adaptive feedback signals;

wherein said second data signal is caused to appear delayed by a time interval substantially equal to said data symbol period such that said feedback means emulates symbol-spaced feedback means.

35. An apparatus including an adaptive coefficient signal generator for use in an adaptive signal equalizer with fractionally-spaced feedback and in which an adaptively equalized data signal forms a pre-slicer data signal that is sliced to provide a post-slicer data signal, comprising:

first multiplier means for multiplying a plurality of multiplicand signals and providing a first plurality of product signals, wherein said plurality of multiplicand signals comprises a first data signal corresponding to a post-slicer data signal and having a data symbol period associated therewith, a second data signal corresponding to said first data signal and delayed by a fraction of said data symbol period, and an error signal corresponding to a difference between said post-slicer data signal and a pre-slicer data signal, and said first plurality of product signals comprises a first product signal corresponding to a product of said first data signal and said error signal, and a second product signal corresponding to a product of said second data signal and said error signal;

first controller means for processing said first plurality of product signals and first and second adaptation control signals and providing a plurality of adaptive coefficient signals and a third adaptation control signal related to one of said plurality of adaptive coefficient signals; and second controller means for processing said first plurality of product signals and said third adaptation control signal and providing said first and second adaptation control signals.

36. The apparatus of claim 35, further comprising:

feedback means for delaying said post-slicer data signal in a successively fractionally-spaced manner and providing said first and second data signals; and second multiplier means for multiplying said first and second data signals and said plurality of adaptive coefficient signals and providing a plurality of adaptive feedback signals;

wherein said second data signal is caused to appear delayed by a time interval substantially equal to said data symbol period such that said feedback means emulates symbol-spaced feedback means.

37. The apparatus of claim 35, wherein:

said first adaptation control signal has a first value bounded by lower and upper values; and said second adaptation control signal has a second value related to a difference between a normalized value and said first value.

38. The apparatus of claim 35, wherein said first controller means comprises:

second multiplier means for multiplying said first plurality of product signals and said first and second adaptation control signals and providing a second plurality of product signals comprising a third product signal corresponding to a product of said first product signal and said first adaptation control signal, and a fourth product signal corresponding to a product of said second product signal and said second adaptation control signal;

combiner means for combining said second plurality of product signals and providing a combined signal;

integrator means for integrating said combined signal and providing said third adaptation control signal; and third multiplier means for multiplying said first, second and third adaptation control signals and providing said plurality of adaptive coefficient signals.

39. The apparatus of claim 35, wherein said second controller means comprises:

signal combiner means for combining said first plurality of product signals and providing a combined signal;

second multiplier means for multiplying said third adaptation control signal and said combined signal and providing a third product signal;

integrator means for integrating said third product signal and providing said first adaptation control signal; and complement means for complementing said first adaptation control signal and providing said second adaptation control signal.

40. An apparatus including an adaptive coefficient signal generator for use in an adaptive signal equalizer with fractionally-spaced feedback and in which an equalization feedback signal adaptively equalizes a data signal to form a pre-slicer data signal that is sliced to provide a post-slicer data signal, comprising:

first multiplier means for receiving and multiplying a plurality of multiplicand signals and providing a plurality of product signals, wherein said plurality of multiplicand signals comprises a first data signal corresponding to a post-slicer data signal and having a data symbol period associated therewith, a second data signal corresponding to said first data signal and delayed by a fraction of said data symbol period, an error signal corresponding to a difference between said post-slicer data signal and a pre-slicer data signal, a first adaptation control signal having a first value bounded by lower and upper values, and a second adaptation control signal having a second value related to a difference between a normalized value and said first value, and said plurality of product signals comprises
a first product signal corresponding to a product of said first data signal, said error signal and said first adaptation control signal, and
a second product signal corresponding to a product of said second data signal, said error signal and said second adaptation control signal;
first combiner means for combining said plurality of product signals and providing a first combined signal;
signal integrator means for integrating said first combined signal and providing a third adaptation control signal;
second multiplier means for multiplying said first, second and third adaptation control signals and providing a plurality of adaptive coefficient signals;
differentiator means for receiving and differentiating an equalization feedback signal and providing a differentiated signal;
third multiplier means for multiplying said error signal and said differentiated signal and providing said first adaptation control signal; and
complement means for complementing said first adaptation control signal and providing said second adaptation control signal.

41. The apparatus of claim 40, further comprising:
feedback means for delaying said post-slicer data signal in a successively fractionally-spaced manner and providing said first and second data signals;
fourth multiplier means for multiplying said first and second data signals and said plurality of adaptive coefficient signals and providing a plurality of adaptive feedback signals; and
second combiner means for combining said plurality of adaptive feedback signals and providing said equalization feedback signal;
wherein said second data signal is caused to appear delayed by a time interval substantially equal to said data symbol period such that said fractionally-spaced feedback circuitry emulates symbol-spaced feedback circuitry.

42. An apparatus including an adaptive coefficient signal generator for use in an adaptive signal equalizer with fractionally-spaced feedback and in which an equalization feedback signal adaptively equalizes a data signal to form a pre-slicer data signal that is sliced to provide a post-slicer data signal, comprising:
first controller means for receiving and processing a plurality of input signals and first and second adaptation control signals and providing a plurality of adaptive coefficient signals, wherein said plurality of input signals comprises
a first data signal corresponding to a post-slicer data signal and having a data symbol period associated therewith,
a second data signal corresponding to said first data signal and delayed by a fraction of said data symbol period, and
an error signal corresponding to a difference between said post-slicer data signal and a pre-slicer data signal; and
second controller means for receiving and processing said error signal and an equalization feedback signal and providing said first and second adaptation control signals.

43. The apparatus of claim 42, further comprising:
feedback means for delaying said post-slicer data signal in a successively fractionally-spaced manner and providing said first and second data signals;
multiplier means for multiplying said first and second data signals and said plurality of adaptive coefficient signals and providing a plurality of adaptive feedback signals; and
combiner means for combining said plurality of adaptive feedback signals and providing said equalization feedback signal;
wherein said second data signal is caused to appear delayed by a time interval substantially equal to said data symbol period such that said fractionally-spaced feedback circuitry emulates symbol-spaced feedback circuitry.

44. The apparatus of claim 42, wherein:
said first adaptation control signal has a first value bounded by lower and upper values; and
said second adaptation control signal has a second value related to a difference between a normalized value and said first value.

45. The apparatus of claim 42, wherein said first controller means comprises:
first multiplier means for multiplying said plurality of input signals and said first and second adaptation control signals and providing a plurality of product signals comprising
a first product signal corresponding to a product of said first data signal, said error signal and said first adaptation control signal, and
a second product signal corresponding to a product of said second data signal, said error signal and said second adaptation control signal;
combiner means for combining said plurality of product signals and providing a combined signal;
integrator means for integrating said combined signal and providing a third adaptation control signal; and
second multiplier means for multiplying said first, second and third adaptation control signals and providing said plurality of adaptive coefficient signals.

46. The apparatus of claim 42, wherein said second controller means comprises:
differentiator means for differentiating said equalization feedback signal and providing a differentiated signal;
multiplier means for multiplying said error signal and said differentiated signal and providing said first adaptation control signal; and
complement means for complementing said first adaptation control signal and providing said second adaptation control signal.

47. A method for generating adaptive coefficient signals for adaptive signal equalization using fractionally-spaced feedback to generate an adaptively equalized data signal as a pre-slicer data signal that is sliced to provide a post-slicer data signal, comprising:
receiving and multiplying a plurality of multiplicand signals to generate a plurality of interim product signals and a plurality of final product signals, wherein
said plurality of multiplicand signals comprises
a first data signal corresponding to a post-slicer data signal and having a data symbol period associated therewith,
a second data signal corresponding to said first data signal and delayed by a fraction of said data symbol period,
an error signal corresponding to a difference between said post-slicer data signal and a pre-slicer data signal, a first adaptation control signal having a first value bounded by lower and upper values, and a second adaptation control signal having a second value related to a difference between a normalized value and said first value, said plurality of interim product signals comprises a first interim product signal corresponding to a product of said first data signal and said error signal, and a second interim product signal corresponding to a product of said second data signal and said error signal, and said plurality of final product signals comprises a first final product signal corresponding to a product of said first interim product signal and said first adaptation control signal, and a second final product signal corresponding to a product of said second interim product signal and said second adaptation control signal;

combining said plurality of final product signals to generate a first combined signal;

integrating said first combined signal to generate a third adaptation control signal;

multiplying said first, second and third adaptation control signals to generate a plurality of adaptive coefficient signals;

combining said plurality of interim product signals to generate a second combined signal;

multiplying said third adaptation control signal and said second combined signal to generate another product signal;

integrating said another product signal to generate said first adaptation control signal; and complementing said first adaptation control signal to generate said second adaptation control signal.

48. The method of claim 47, further comprising:

delaying said post-slicer data signal in a successively fractionally-spaced manner to generate said first and second data signals; and multiplying said first and second data signals and said plurality of adaptive coefficient signals to generate a plurality of adaptive feedback signals;

wherein said second data signal is caused to appear delayed by a time interval substantially equal to said data symbol period such that said delaying said post-slicer data signal in a successively fractionally-spaced manner to generate said first and second data signals emulates delaying said post-slicer data signal in a successively symbol-spaced manner to generate said first and second data signals.

49. A method for generating adaptive coefficient signals for adaptive signal equalization using fractionally-spaced feedback to generate an adaptively equalized data signal as a pre-slicer data signal that is sliced to provide a post-slicer data signal, comprising:

receiving and multiplying a plurality of multiplicand signals to generate a first plurality of product signals, wherein said plurality of multiplicand signals comprises a first data signal corresponding to a post-slicer data signal and having a data symbol period associated therewith, a second data signal corresponding to said first data signal and delayed by a fraction of said data symbol period, and an error signal corresponding to a difference between said post-slicer data signal and a pre-slicer data signal, and said first plurality of product signals comprises a first product signal corresponding to a product of said first data signal and said error signal, and a second product signal corresponding to a product of said second data signal and said error signal;

processing said first plurality of product signals and first and second adaptation control signals to generate a plurality of adaptive coefficient signals and a third adaptation control signal related to one of said plurality of adaptive coefficient signals; and processing said first plurality of product signals and said third adaptation control signal to generate said first and second adaptation control signals.

50. The method of claim 49, further comprising:

delaying said post-slicer data signal in a successively fractionally-spaced manner to generate said first and second data signals; and multiplying said first and second data signals and said plurality of adaptive coefficient signals to generate a plurality of adaptive feedback signals;

wherein said second data signal is caused to appear delayed by a time interval substantially equal to said data symbol period such that said delaying said post-slicer data signal in a successively fractionally-spaced manner to generate said first and second data signals emulates delaying said post-slicer data signal in a successively symbol-spaced manner to generate said first and second data signals.

51. The method of claim 49, wherein said processing said first plurality of product signals and said third adaptation control signal to generate said first and second adaptation control signals comprises:

generating said first adaptation control signal with a first value bounded by lower and upper values; and generating said second adaptation control signal with a second value related to a difference between a normalized value and said first value.

52. The method of claim 49, wherein said processing said first plurality of product signals and first and second adaptation control signals to generate a plurality of adaptive coefficient signals and a third adaptation control signal related to one of said plurality of adaptive coefficient signals comprises:

multiplying said first plurality of product signals and said first and second adaptation control signals to generate a second plurality of product signals comprising a third product signal corresponding to a product of said first product signal and said first adaptation control signal, and a fourth product signal corresponding to a product of said second product signal and said second adaptation control signal;

combining said second plurality of product signals to generate a combined signal;

integrating said combined signal to generate said third adaptation control signal; and multiplying said first, second and third adaptation control signals to generate said plurality of adaptive coefficient signals.

53. The apparatus of claim 49, wherein said processing said first plurality of product signals and said third adaptation control signal to generate said first and second adaptation control signals comprises:

combining said first plurality of product signals to generate a combined signal;

multiplying said third adaptation control signal and said combined signal to generate a third product signal;

integrating said third product signal to generate said first adaptation control signal; and complementing said first adaptation control signal to generate said second adaptation control signal.

54. A method for generating adaptive coefficient signals for adaptive signal equalization using fractionally-spaced feedback and an equalization feedback signal to generate an adaptively equalized data signal as a pre-slicer data signal that is sliced to provide a post-slicer data signal, comprising:

receiving and multiplying a plurality of multiplicand signals to generate a plurality of product signals, wherein said plurality of multiplicand signals comprises
a first data signal corresponding to a post-slicer data signal and having a data symbol period associated therewith,
a second data signal corresponding to said first data signal and delayed by a fraction of said data symbol period,
an error signal corresponding to a difference between said post-slicer data signal and a pre-slicer data signal,
a first adaptation control signal having a first value bounded by lower and upper values, and
a second adaptation control signal having a second value related to a difference between a normalized value and said first value, and said plurality of product signals comprises
a first product signal corresponding to a product of said first data signal, said error signal and said first adaptation control signal, and
a second product signal corresponding to a product of said second data signal, said error signal and said second adaptation control signal;

combining said plurality of product signals to generate a first combined signal;

integrating said first combined signal to generate a third adaptation control signal;

multiplying said first, second and third adaptation control signals to generate a plurality of adaptive coefficient signals;

receiving and differentiating an equalization feedback signal to generate a differentiated signal;

multiplying said error signal and said differentiated signal to generate said first adaptation control signal; and complementing said first adaptation control signal to generate said second adaptation control signal.

55. The method of claim 54, further comprising:

delaying said post-slicer data signal in a successively fractionally-spaced manner to generate said first and second data signals;

multiplying said first and second data signals and said plurality of adaptive coefficient signals to generate a plurality of adaptive feedback signals; and combining said plurality of adaptive feedback signals to generate said equalization feedback signal;

wherein said second data signal is caused to appear delayed by a time interval substantially equal to said data symbol period such that said delaying said post-slicer data signal in a successively fractionally-spaced manner to generate said first and second data signals emulates delaying said post-slicer data signal in a successively symbol-spaced manner to generate said first and second data signals.

56. A method for generating adaptive coefficient signals for adaptive signal equalization using fractionally-spaced feedback and an equalization feedback signal to generate an adaptively equalized data signal as a pre-slicer data signal that is sliced to provide a post-slicer data signal, comprising:

receiving and processing a plurality of input signals and first and second adaptation control signals to generate a plurality of adaptive coefficient signals, wherein said plurality of input signals comprises
a first data signal corresponding to a post-slicer data signal and having a data symbol period associated therewith,
a second data signal corresponding to said first data signal and delayed by a fraction of said data symbol period, and
an error signal corresponding to a difference between said post-slicer data signal and a pre-slicer data signal; and receiving and processing said error signal and an equalization feedback signal to generate said first and second adaptation control signals.

57. The method of claim 56, further comprising:

delaying said post-slicer data signal in a successively fractionally-spaced manner to generate said first and second data signals;

multiplying said first and second data signals and said plurality of adaptive coefficient signals to generate a plurality of adaptive feedback signals; and combining said plurality of adaptive feedback signals to generate said equalization feedback signal;

wherein said second data signal is caused to appear delayed by a time interval substantially equal to said data symbol period such that said delaying said post-slicer data signal in a successively fractionally-spaced manner to generate said first and second data signals emulates delaying said post-slicer data signal in a successively symbol-spaced manner to generate said first and second data signals.

58. The method of claim 56, wherein said receiving and processing said error signal and an equalization feedback signal to generate said first and second adaptation control signals comprises:

generating said first adaptation control signal with a first value bounded by lower and upper values; and generating said second adaptation control signal with a second value related to a difference between a normalized value and said first value.

59. The method of claim 56, wherein said receiving and processing a plurality of input signals and first and second adaptation control signals to generate a plurality of adaptive coefficient signals comprises:

receiving and multiplying said plurality of input signals and said first and second adaptation control signals to generate a plurality of product signals comprising
a first product signal corresponding to a product of said first data signal, said error signal and said first adaptation control signal, and
a second product signal corresponding to a product of said second data signal, said error signal and said second adaptation control signal;

combining said plurality of product signals to generate a combined signal;

integrating said combined signal to generate said third adaptation control signal; and multiplying said first, second and third adaptation control signals to generate said plurality of adaptive coefficient signals.

60. The method of claim 56, wherein said receiving and processing said error signal and an equalization feedback signal to generate said first and second adaptation control signals comprises:

differentiating said equalization feedback signal to generate a differentiated signal;

multiplying said error signal and said differentiated signal to generate said first adaptation control signal; and complementing said first adaptation control signal to generate said second adaptation control signal.

\* \* \* \* \*

UNITED STATES PATENT AND TRADEMARK OFFICE
CERTIFICATE OF CORRECTION

PATENT NO. : 6,940,898 B2
DATED : September 6, 2005
INVENTOR(S) : Abhijit G. Shanbhag et al.

It is certified that error appears in the above-identified patent and that said Letters Patent is hereby corrected as shown below:

Column 8,
Line 22, delete "Date" and insert -- Data --.

Column 13,
Lines 18 and 52, delete "11a," and insert -- 111a, --.

Column 18,
Line 47, delete "second," and insert -- second --.

Signed and Sealed this

Eighth Day of November, 2005

JON W. DUDAS
*Director of the United States Patent and Trademark Office*